(12) United States Patent
Grunzke

(10) Patent No.: US 10,014,033 B2
(45) Date of Patent: *Jul. 3, 2018

(54) APPARATUS FOR POWER MANAGEMENT

(71) Applicant: MICRON TECHNOLOGY, INC., Boise, ID (US)

(72) Inventor: Terry Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/609,286

(22) Filed: May 31, 2017

(65) Prior Publication Data

US 2017/0263292 A1    Sep. 14, 2017

Related U.S. Application Data

(63) Continuation of application No. 15/054,409, filed on Feb. 26, 2016, now Pat. No. 9,679,616, which is a continuation of application No. 14/182,719, filed on Feb. 18, 2014, now Pat. No. 9,293,176.

(51) Int. Cl.
| | |
|---|---|
| *G11C 8/08* | (2006.01) |
| *G11C 5/14* | (2006.01) |
| *G11C 5/04* | (2006.01) |
| *G11C 8/18* | (2006.01) |
| *G11C 7/22* | (2006.01) |

(52) U.S. Cl.
CPC ............... *G11C 5/148* (2013.01); *G11C 5/04* (2013.01); *G11C 5/14* (2013.01); *G11C 8/08* (2013.01); *G11C 8/18* (2013.01); *G11C 7/22* (2013.01)

(58) Field of Classification Search
CPC .................................. G11C 8/08; G11C 5/14
USPC ................................................. 365/233.5, 226
See application file for complete search history.

(56) References Cited

U.S. PATENT DOCUMENTS

| | | | | | |
|---|---|---|---|---|---|
| 6,147,916 | A | * | 11/2000 | Ogura | G11C 7/06 365/203 |
| 6,166,990 | A | * | 12/2000 | Ooishi | G11C 7/22 365/194 |
| 6,563,759 | B2 | * | 5/2003 | Yahata | G11C 7/1066 365/189.05 |
| 6,671,787 | B2 | * | 12/2003 | Kanda | G11C 7/1021 365/189.02 |
| 6,754,126 | B2 | * | 6/2004 | Yamaguchi | G11C 7/1006 365/220 |
| 6,924,684 | B1 | * | 8/2005 | Nguyen | G06F 7/68 327/122 |
| 7,456,680 | B2 | | 11/2008 | Gyohten et al. | |
| 7,460,432 | B2 | * | 12/2008 | Warner | G11C 7/12 365/234 |
| 7,701,764 | B2 | | 4/2010 | Nguyen | |
| 7,818,464 | B2 | * | 10/2010 | Pyeon | G11C 5/066 365/230.06 |
| 7,969,813 | B2 | * | 6/2011 | Bringivijayaraghavan | G11C 7/1078 365/230.06 |
| 8,030,959 | B2 | | 10/2011 | Franco et al. | |

(Continued)

*Primary Examiner* — Michael Tran
(74) *Attorney, Agent, or Firm* — Dicke, Billig & Czaja, PLLC

(57) ABSTRACT

Apparatus include an array of memory cells, a controller to perform access operations on the array of memory cells, a clock signal node, a counter having an input selectively connected to the clock signal node, and a clock generator having an output connected to the input of the counter.

21 Claims, 20 Drawing Sheets

(56) References Cited

U.S. PATENT DOCUMENTS

| | | | |
|---|---|---|---|
| 8,248,881 B2 | 8/2012 | Roohparvar | |
| 8,386,818 B2 | 2/2013 | Hong | |
| 8,576,652 B2 * | 11/2013 | Koszizuka | G11C 5/04 |
| | | | 365/222 |
| 8,953,409 B2 * | 2/2015 | Ishikawa | G11C 11/406 |
| | | | 365/194 |
| 2010/0275050 A1 | 10/2010 | Hong | |
| 2011/0173462 A1 | 7/2011 | Wakrat et al. | |
| 2012/0221880 A1 | 8/2012 | Kim et al. | |
| 2012/0290864 A1 | 11/2012 | Seroff | |
| 2012/0331282 A1 | 12/2012 | Yurzola et al. | |
| 2014/0195734 A1 | 7/2014 | Ha et al. | |
| 2015/0006916 A1 | 1/2015 | Knoth et al. | |

* cited by examiner

APPARATUS FOR POWER MANAGEMENT

RELATED APPLICATIONS

This Application is a continuation of U.S. patent application Ser. No. 15/054,409, titled "POWER MANAGEMENT," filed Feb. 26, 2016, now U.S. Pat. No. 9,679,616 issued on Jun. 13, 2017, which is a continuation of U.S. patent application Ser. No. 14/182,719, titled "POWER MANAGEMENT," filed Feb. 18, 2014, now U.S. Pat. No. 9,293,176 issued on Mar. 22, 2016, which are commonly assigned and incorporated herein by reference.

TECHNICAL FIELD

The present disclosure relates generally to memory and, in particular, in one or more embodiments, the present disclosure relates to apparatus utilizing a counter in power management.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Power consumption is often an important consideration in the design and usage of memory devices. Problems may arise when multiple memory devices are operated concurrently. Such problems could include exceeding power consumption specifications and/or availability.

For the reasons stated above, and for other reasons stated below which will become apparent to those skilled in the art upon reading and understanding the present specification, there is a need in the art for alternative methods of managing power, and apparatus to perform such methods.

DETAILED DESCRIPTION

Figure 1:
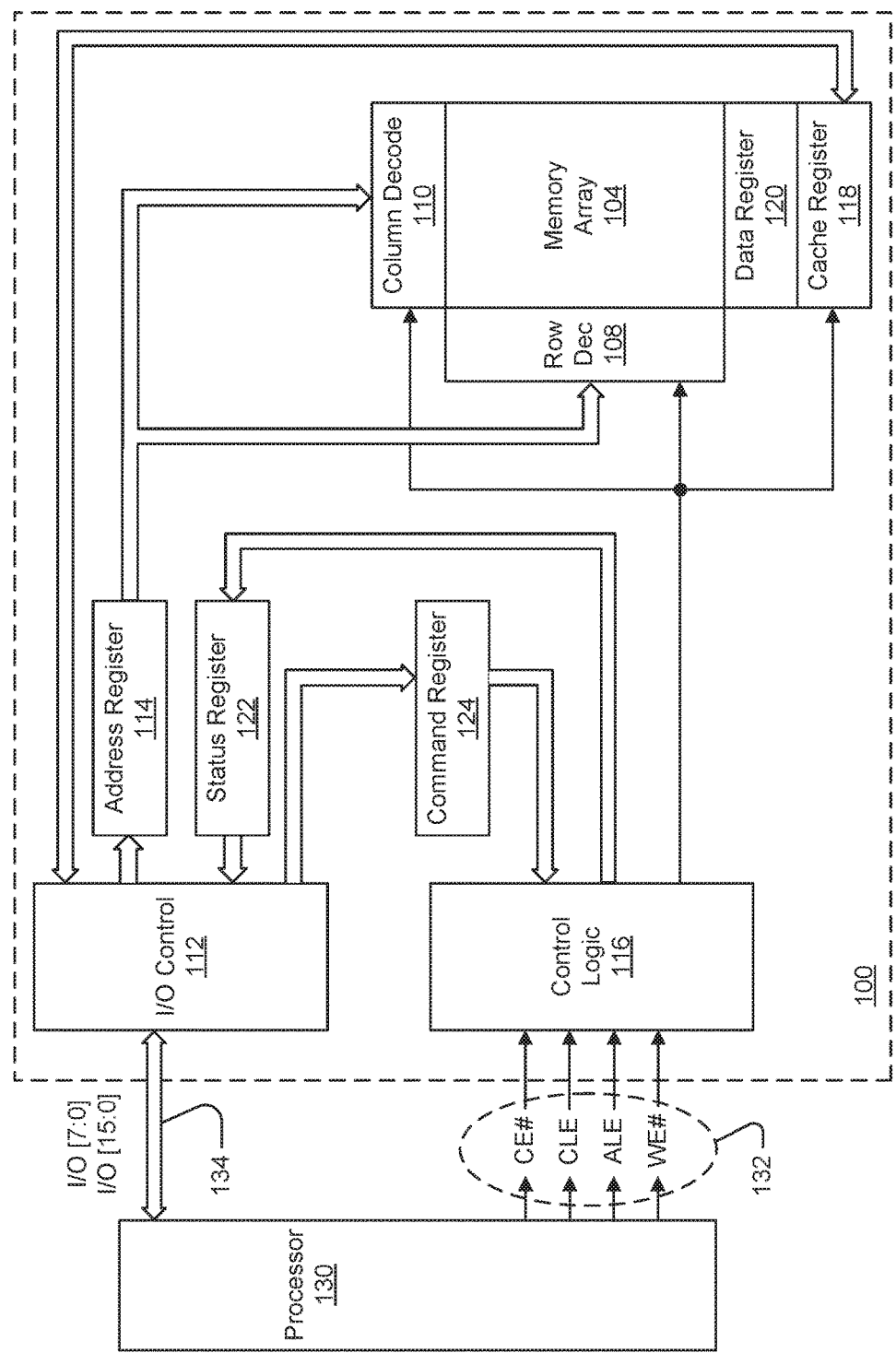
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Memory device access operations (e.g., write operations, read operations or erase operations) have varying current, and thus power, demands throughout the operations. Allowing multiple memory devices of an electronic system to proceed with access operations concurrently can exceed power availability, such as when too many devices are performing access operations.

A variety of techniques have been utilized to manage power consumption of memory systems containing multiple memory devices (e.g., dies, modules and/or packages), many of which rely on a memory controller to stagger the activity of the memory devices seeking to avoid performing high power portions of access operations concurrently in more than one memory device. Several of these techniques are discussed in U.S. Provisional Patent Application Ser. No. 61/749,768 (see, e.g., pages 12-17).

Various embodiments described herein facilitate power management among multiple apparatus. In multi-die operations with peak power management, each die may be given an opportunity to be able to participate in a sequence of operations, where more than one die may be permitted to experience portions of their respective operations deemed to be of high current demand (as used herein, a "portion of an operation" can, in some embodiments, include the entire operation). In various embodiments, one die of a multi-die package can provide (e.g., generate) a clock for maintaining a die priority order between multiple dies, and the other dies can share this clock. A high current indication signal can be shared between these dies to indicate whether any of the dies is experiencing (e.g., is about to enter or is in) a high current demand portion of an operation. The high current indication signal may also be used to provide, in conjunction with the clock, an indication of a magnitude of a current expected to be consumed by the die during the high current demand portion of the operation (e.g., a relative unit magnitude).

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a write operation (e.g., program operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
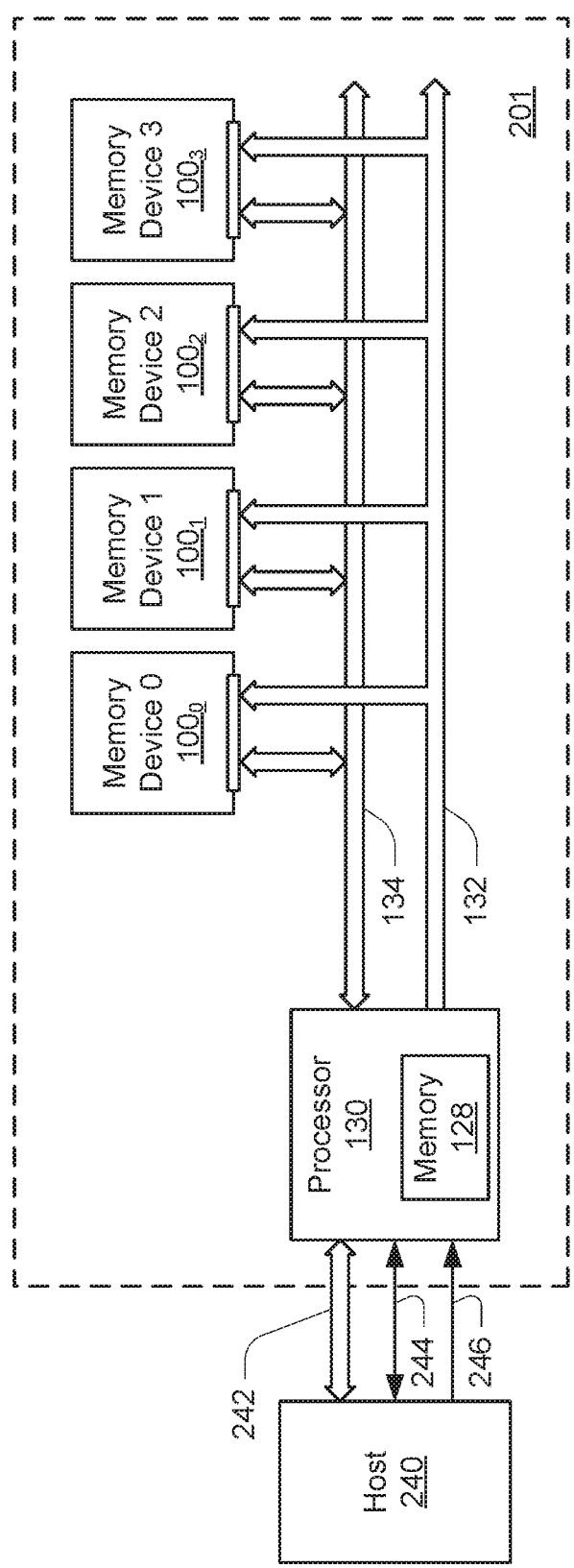
FIG. 2 is a simplified block diagram of a memory module in communication with a host as part of an electronic system, according to another embodiment.

A given processor 130 may be in communication with one or more memory devices 100, e.g., dies. FIG. 2 is a simplified block diagram of an apparatus in the form of a memory module 201 in communication with a host 240 as part of an electronic system, according to another embodiment. Memory devices 100 and processor 130 may be as described with reference to FIG. 1. Although memory module (e.g., package) 201 is depicted with four memory devices 100 (e.g., dies), memory module could have one or more memory devices 100.

Because processor 130 (e.g., a memory controller) is between the host 240 and the memory devices 100, communication between the host 240 and the processor 130 may involve different communication links than those used between the processor 130 and the memory devices 100. For example, the memory module 201 may be an Embedded MultiMediaCard (eMMC) of a solid state drive (SSD). In accordance with existing standards, communication with an eMMC may include a data link 242 for transfer of data (e.g., an 8-bit link), a command link 244 for transfer of commands and device initialization, and a clock link 246 providing a clock signal for synchronizing the transfers on the data link 242 and command link 244. The processor 130 may handle many activities autonomously, such as error correction, management of defective blocks, wear leveling and address translation.

Figure 3:
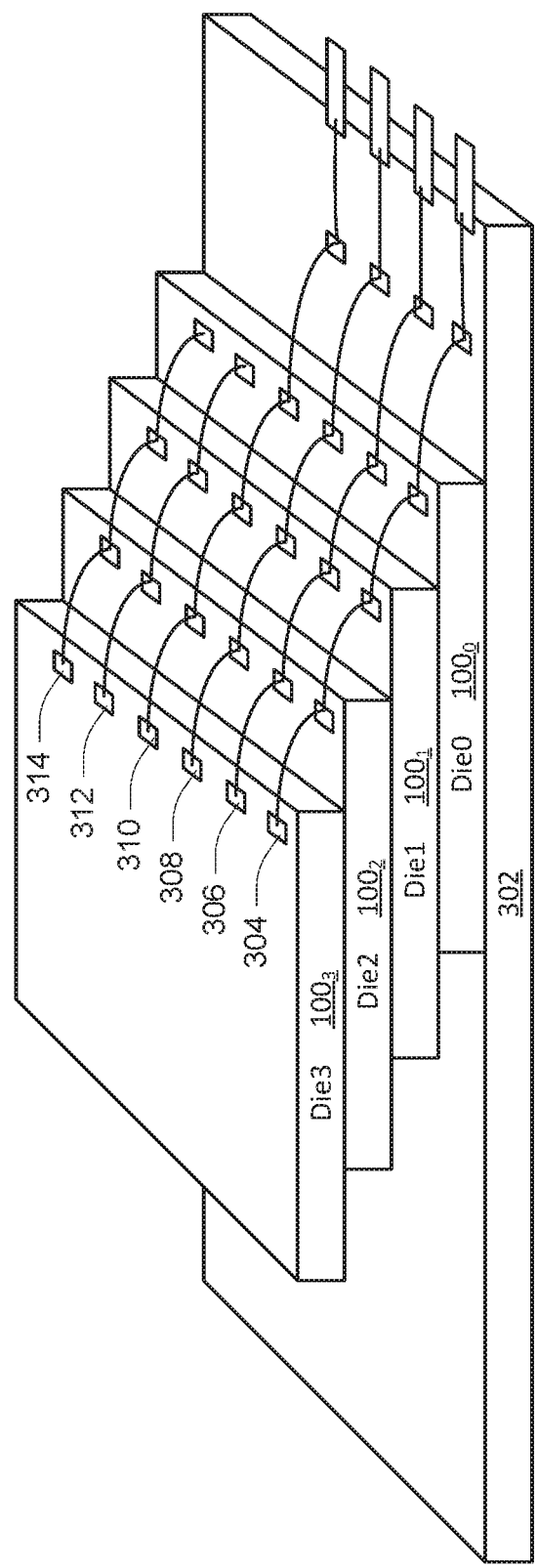
FIG. 3 is a perspective view of a representation of a multi-die package according to an embodiment.

FIG. 3 is a perspective view of a representation of a multi-die package 302 according to an embodiment. Multi-die package 302 is depicted to include four dies 100 (i.e., $100_0$-$100_3$ corresponding to Die0-Die3), although multi-die packages could have fewer or more such dies. Each of the dies 100, as well as the package 302, may include a node 304 (e.g., a pad) for providing a ready/busy control signal RB#. The ready/busy control signal may be used to indicate to a host device or to the dies 100 in the multi-die package 302 whether one or more of the dies 100 are busy performing an operation. As such, the ready/busy control signal nodes 304 may be commonly connected. Each of the dies 100, as well as the package 302, may include a node 306 for providing input/output (I/O) signals. Note that each node 306 may represent more than one physical node, e.g., one pad for each signal of the I/O bus 134 of FIG. 1 for each of the dies 100 and the multi-package 302. The nodes 306 may be commonly connected. Each of the dies 100, as well as the package 302, may include a node 308 for providing control signals. Note that each node 308 may represent more than one physical node, e.g., one pad for each signal of the control link 132 of FIG. 1 for each of the dies 100 and the multi-package 302. The nodes 308 may be commonly connected. Each of the dies 100, as well as the package 302, may include a node 310 (e.g., a pad) for providing a chip enable signal CE#. The chip enable signal may be used to enable access to the dies 100 in the multi-die package 302. As such, the nodes 310 may be commonly connected. Each of the dies 100, as well as the package 302, may include a node 312 for providing a high current indication signal HC#. The high current indication signal HC# may be shared between the dies 100 and with a host device to indicate when one of the dies 100 is experiencing a high current demand portion of an operation. In conjunction with secondary clock cycles of the internal clock signal ICLK, as described in more detail later, the high current indication signal HC# can provide an indication of high current demand to other devices sharing the internal clock signal ICLK. The nodes 312 may be commonly connected, but no connection to the multi-die package is needed. Each of the dies 100 may include a node 314 for providing an internal clock signal ICLK. The clock signal may be shared between the dies 100. Use of the clock signal will be described with reference to subsequent figures. The nodes 314 may be commonly connected among the dies 100, but no connection to the multi-die package is needed.

Figure 4A:
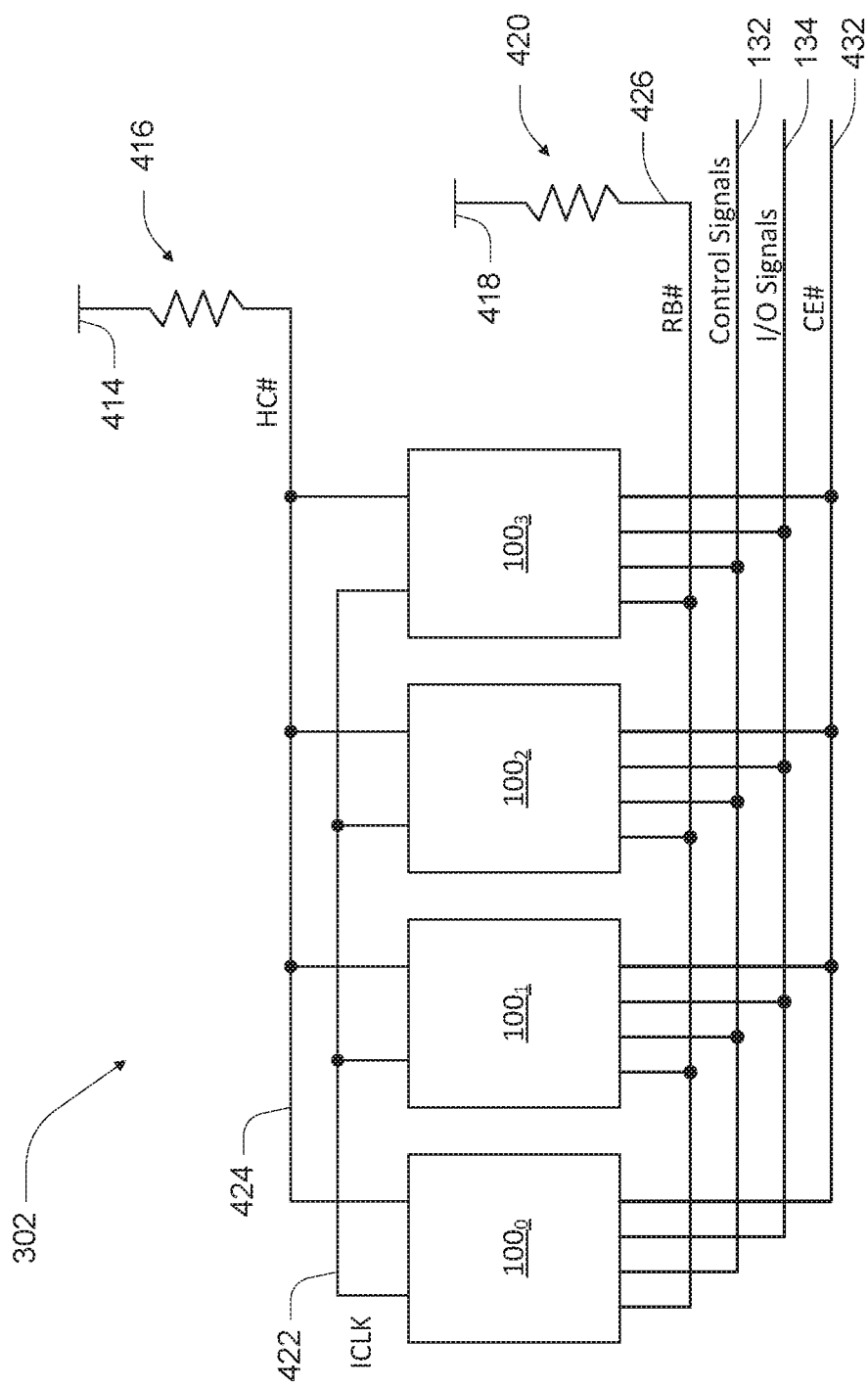
FIG. 4a is a schematic representation of a multi-die package according to an embodiment.

FIG. 4a is a schematic representation of the multi-die package 302 including four dies 100 (e.g., $100_0$-$100_3$) according to an embodiment. The clock signal ICLK is commonly shared between the dies 100 through a clock signal node (e.g., line) 422. The high current indication signal HC# is commonly shared between the dies 100 through a high current indication signal node (e.g., line) 424. The high current indication signal HC# may be normally pulled to a particular state (e.g., pulled high), such as by connecting the high current indication signal node 424 to a voltage supply node 414, coupled to receive a supply voltage such as Vcc, through a resistor 416, sometimes collectively referred to as a weak pull-up resistor, or simply a pull-up resistor.

The ready/busy control signal RB# is commonly shared between the dies 100 through a ready/busy control signal node (e.g., line) 426. The ready/busy control signal RB# may be normally pulled to a particular state (e.g., pulled high), such as by connecting the ready/busy control signal node 426 to a voltage supply node 418 through a resistor 420. Each of the dies 100 is further commonly connected to a control link 132 and to an I/O bus 134.

Figure 4B:
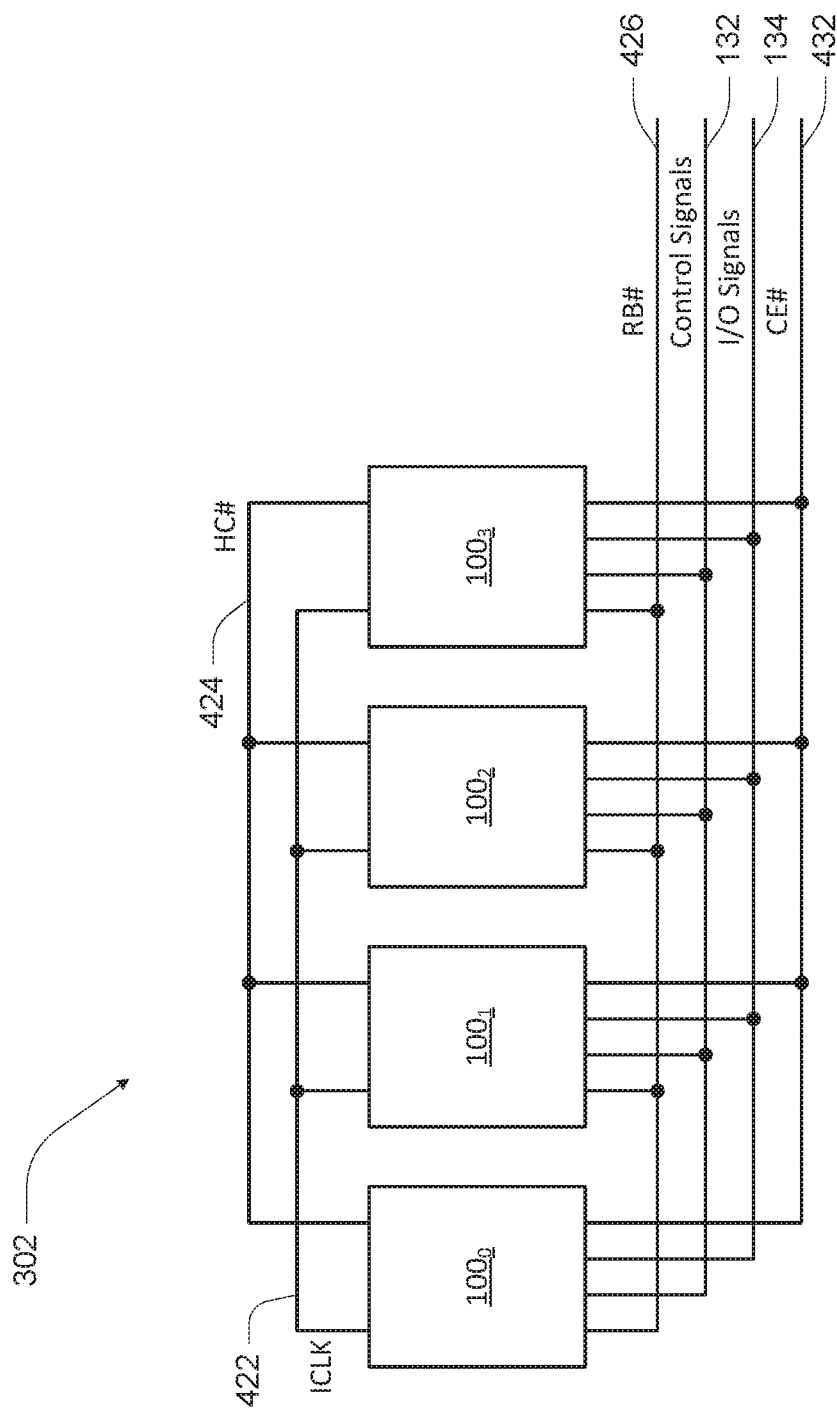
FIG. 4b is a schematic representation of a multi-die package according to another embodiment.

FIG. 4b is a schematic representation of the multi-die package 302 including four dies 100 (e.g., $100_0$-$100_3$) according to an embodiment. The multi-die package 302 of FIG. 4b differs from the multi-die package of FIG. 4a in that neither the high current indication signal node 424 nor the ready/busy control signal node 426 are depicted to be connected to a pull-up resistor. Such a configuration might be used where it is desired to not rely on an external pull-up resistor for the high current indication signal node 424 or the ready/busy control signal node 426.

Peak power management as described herein might be utilized, for example, during write operations, read operations and erase operations, where periods of high current demand may be common. For example, precharging access lines for an access operation, e.g., a write operation or a read operation, may be deemed a high current demand portion of the access operation. Other access operations may also benefit from such peak power management. As used herein, a high current does not refer to any particular current level. Instead, the term "high current demand portion of an operation" may refer to a portion (e.g., period) of an operation of a device where it is desired, during that portion, to restrict current usage of other devices commonly sharing the clock signal ICLK.

Various embodiments facilitate having more than one die experiencing high current demand portions of their operations concurrently if a particular unit limit is not exceeded. The unit limit might simply be a maximum number of dies permitted to concurrently experience high current demand portions of their operations, or it might incorporate some relative or quantitative magnitude of expected current consumption. As one example, a multi-die package may be configured to permit only two dies to concurrently experience high current demand portions of their operations. As another example, the unit limit might take into account differing current demand for similar operations between different dies. For example, if Die3 was expected to use more current for access operations than Die2, Die2 was expected to use more current for access operations than Die1, and Die1 was expected to use similar current for access operations as Die0, Die3 might be assigned three units when it enters a period of high current demand, Die2 might be assigned two units when it enters a period of high current demand, and Die1 and Die0 might each be assigned one unit when they enter periods of high current demand. In this example, if the unit limit were four units, Die0, Die1 and Die2 would be permitted to be within periods of high current demand concurrently, but Die3 and Die2 would not be permitted to be within periods of high current demand concurrently. This unit assignment for each die may further take into consideration a quantitative magnitude of current demand difference, rather than merely a relative magnitude of current demand difference. For example, if Die3 were expected to use 20% more current than Die0, Die3 might be assigned 1.2 units for each unit assigned to Die0 (e.g., a unit multiplier of 1.2) to more closely provide a quantitative indication of expected current consumption. Each die sharing the internal clock signal ICLK may store the unit assignments for all such dies as well as the unit limit, such as within their respective arrays of memory cells, or some other storage area within each respective die, such as a volatile or nonvolatile register. It is noted that while unit consumption of current may be related to an expected level of current usage, it may not be proportional to actual current usage. In fact, while unit assignments might be assigned based on expected operating characteristics, changes in environmental conditions or deterioration of a device, for example, may alter its actual current demand from those expectations.

While the internal clock signal ICLK is active, each die sharing the internal clock signal ICLK can monitor unit consumption of current across the dies sharing the internal clock signal ICLK. A counter (e.g., a wrap-around counter) can generate a series of counter values, such as values corresponding to (e.g., assigned to) each die sharing the internal clock signal ICLK, then repeat the series. For example, if there are N dies sharing the internal clock signal ICLK, the wrap-around counter may iteratively count from 0 to N−1. When a count value of the wrap-around counter matches a counter value assigned to a die, the corresponding die may indicate to other dies whether it is experiencing (e.g., is about to enter or is presenting performing) a portion of an access operation deemed to be of high current demand, presuming that the access operation is paused and waiting for an indication that it may resume. The indication may further include an indication of magnitude of current that the die is expected to consume (e.g., the relative amount or quantity of current the die is about to consume or is presently consuming). For embodiments assigning different units to different dies, each die may determine (e.g., track) which other die provided such an indication in order to add the appropriate unit to a tally of total unit consumption. This is made possible as each die will know the value of the wrap-around counter at the time the indication was received.

Each die can pause its access operations at designated points (e.g., prior to entering a period of high current demand) until a value of a wrap-around counter matches a counter value assigned to that die. When the counter values match, if the die is presently waiting to enter a period of high current demand, the die can compare the total unit consumption of current that it has determined (e.g., tallied) from the dies sharing the internal clock signal ICLK. If the total unit consumption is less than or equal to the unit limit, the die can enter its period of high current demand by resuming the access operation, and can indicate to other dies that it has done so. The total unit consumption compared to the unit limit may include the expected consumption of the die making the comparison, such that this die will only enter its period of high current demand if doing so would not exceed the unit limit. Alternatively, the total unit consumption may disregard the expected consumption of the die making the comparison, such that this die will enter its period of high current demand if the total unit consumption of the remaining dies does not exceed the unit limit. Regardless of whether the die was waiting to enter a period of high current demand, the die can reset its tally of total unit consumption, e.g., prior to, or in response to, the next count of the wrap-around counter or the next cycle of the internal clock signal ICLK. Note that if each die resets its tally of total unit consumption, each die may have a different value for the total unit consumption. However, each die may make its own determination based on the total unit consumption it has determined at the time the value of the wrap-around counter matches the counter value assigned to that die.

Figure 5:
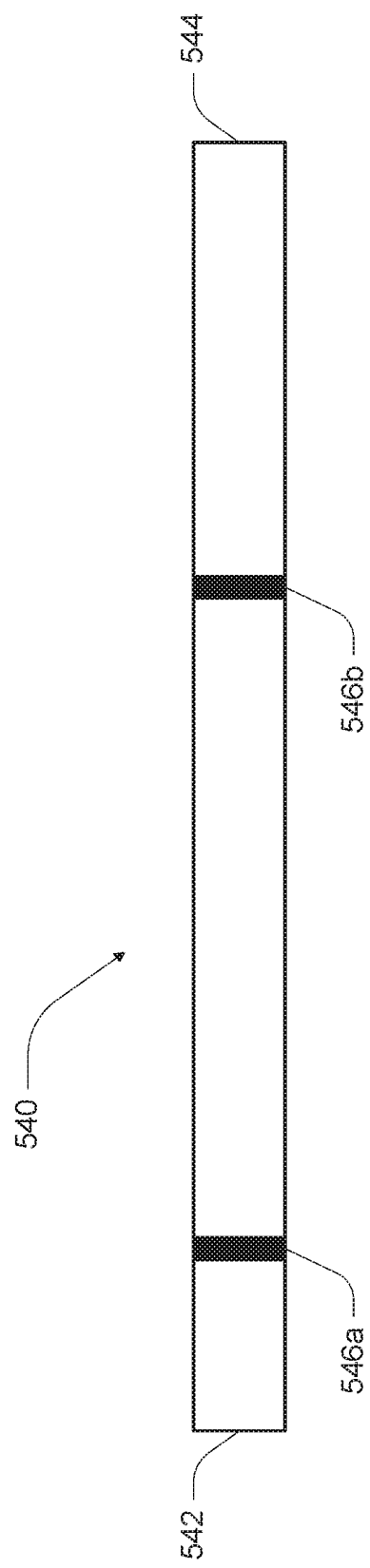
FIG. 5 is a representation of a time-line of an access operation showing designated points for pausing the access operation according to an embodiment.

FIG. 5 is a representation of a time-line 540 of an access operation showing designated points 546 (e.g., 546a and 546b) for pausing the access operation according to an embodiment. The time-line 540 might represent an access operation proceeding from an initiation at 542 until a completion at 544. The access operation may have one or more designated points 546 (e.g., 546a and 546b) where the access operation will pause and wait for an indication that it can resume the access operation as described above. The designated points 546 may represent particular steps of an algorithm (e.g., such as might be executed by an internal controller of the die) for performing the access operation that precede portions of the access operation that are deemed to be of high current demand. For example, the access operation may begin at 542 and proceed until it reaches designated point 546a. At designated point 546a, the access operation may pause and wait until the value of the wrap-around counter matches a counter value assigned to the die performing the access operation, and the total unit consumption is less than or equal to the unit limit. At that point the access operation may resume, where it may proceed until it reaches designated point 546b. At designated point 546b, the access operation may again pause and wait until the value of the wrap-around counter matches a counter value assigned to the die performing the access operation, and the total unit consumption is less than or equal to the unit limit. At that point the access operation may resume, where it may proceed until it reaches completion at 544.

It is noted that there may be situations where a particular die will not reach a condition where the value of the wrap-around counter matches a counter value assigned to the particular die and the total unit consumption determined by the particular die is less than or equal to the unit limit, such that it may be stalled for an unacceptable amount of time. To mitigate such situations, each die may further include a time-out timer, such that if the die has been waiting for a particular amount of time, it may provide the indication that it is entering its period of high current demand, but not actually enter the period of high current demand. By indicating the die is experiencing a high current demand portion of an operation without the die actually experiencing a high current demand portion of an operation, the unit limit will not be exceeded, and an opportunity will eventually be opened for the die to proceed as other die might only proceed with new periods of high current demand if they can be initiated in view of the determination of unit consumption for the die that has timed out.

Figure 6:
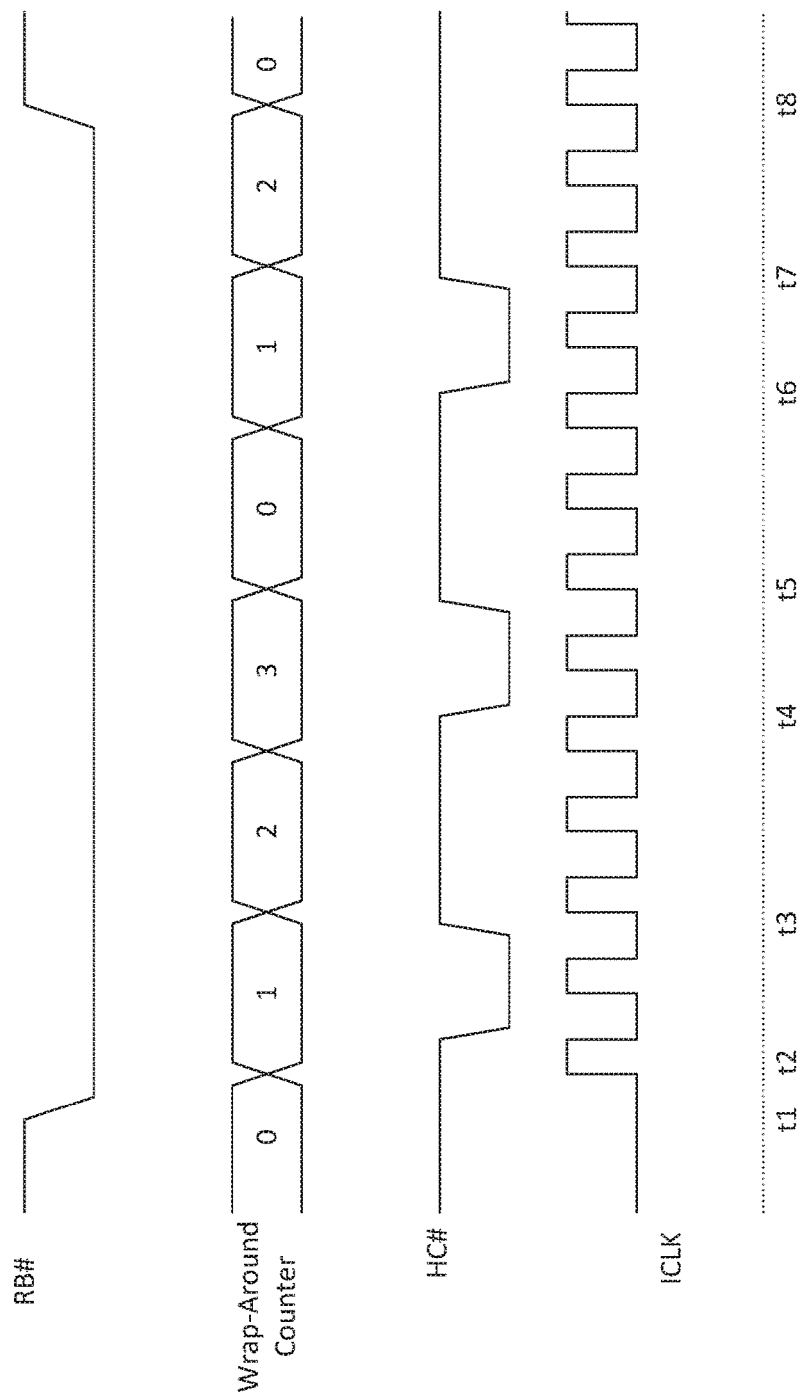
FIG. 6 is one example of a timing diagram showing operation of a multi-die package of the type depicted in FIG. 4a or 4b according to an embodiment.

FIG. 6 is one example of a timing diagram showing operation of a multi-die package of the type depicted in FIG. 4a or 4b according to an embodiment. Access operations in each die may pause at one or more designated points prior to entering a high current demand portion of that access operation as discussed with reference to FIG. 5, and might check if they can enter the high current demand portion only when a value of a wrap-around counter matches a counter value assigned to each corresponding die.

In the example of FIG. 6, and with reference to the dies 100 of FIG. 4a or 4b, dies $100_0/100_1/100_2/100_3$ (i.e., Die0/Die1/Die2/Die3) may be assigned the counter values 0/1/2/3, respectively. Each die's counter value may be assigned by MDS pins or during an assignment step while setting features of the die during an initialization of that die. Referring to FIG. 6, at time t1, the ready/busy control signal RB# transitions to a logic low, indicating that at least one of the dies is busy performing an operation. In response, the internal clock signal ICLK may begin. Alternatively, the internal clock signal ICLK may be independent of the ready/busy control signal RB#, and might be started in response to a command from an external controller when that external controller seeks to cause one of the dies 100 to perform an access operation. A wrap-around counter (described in more detail later) responsive to the internal clock signal ICLK begins counting. As will be described with reference to FIGS. 16 and 17, the wrap-around counter does not count each cycle of the internal clock signal ICLK. Instead, a primary clock cycle (e.g., a first clock cycle) corresponds to a counter increment, and one or more secondary clock cycles (e.g., subsequent clock cycles) are used to determine (e.g., in conjunction with the high current indication signal HC#) whether a die is deemed to be experiencing a high current demand portion of an access operation. In the example of FIG. 6, every other clock cycle (e.g., every odd clock cycle) of the internal clock signal ICLK corresponds to a counter increment, and every other clock cycle (e.g., every even clock cycle) of the internal clock signal ICLK (e.g., in conjunction with the high current indication signal HC#) provides an indication whether a corresponding die is deemed to be experiencing a high current demand portion of an access operation (i.e., is entering or performing a high current demand portion of an access operation).

The dies of a multi-die package sharing the internal clock signal ICLK will look to a value of the high current indication signal HC# during the secondary clock cycles of the internal clock signal ICLK during a count of the wrap-around counter to determine unit consumption for the die corresponding to the value of the wrap-around counter. Where the unit limit is a number of dies, each die may simply count the number of times the high current indication signal HC# is low during each count of the wrap-around counter occurring since the last time the value of the wrap-around counter matched the counter value assigned to that particular die. Where each die is assigned a particular unit, each die may sum the unit assignments for the dies indicating high current demand. When the count value of the wrap-around counter matches the counter value assigned to a particular die, if that die is waiting to enter a period of high current demand, it may compare the number of units of consumption it has counted since its previous cycle of the wrap-around counter to a unit limit. If the unit limit is not exceeded, the corresponding die can resume its access operation and enter its period of high current demand. That die would further transition the high current indication signal HC# for one or more secondary clock cycles to indicate to other dies that it has done so.

In the example of FIG. 6, dies $100_0$ and $100_2$ are not waiting at one of their designated points in an access operation prior to entering a period of high current demand, so no action is taken regarding the high current indication signal HC# when the count value of the wrap-around counter matches the counter values assigned to those dies. Prior to time t2, die $100_1$ may reach a designated point in an access operation prior to entering a period of high current demand for that die, and that access operation may be paused as a result. For example, an internal controller of the die might be configured (e.g., coded) to cause the access operation to pause at one or more designated points, and to wait for a subsequent indication that it can resume. When the wrap-around counter reaches a value corresponding to the counter value assigned to die $100_1$ at time t2, the controller in die $100_1$, assuming its access operation is paused at one of its designated points waiting to perform a high current demand portion, will transition the high current indication signal HC# to a logic low. The high current indication signal HC# may be held low for a subsequent clock cycle of the internal clock signal ICLK, and then released at time t3. Note that release of the high current indication signal HC# does not indicate that die $100_1$ has completed its period of high current demand.

Prior to time t4, die $100_3$ may reach a designated point in an access operation prior to entering a period of high current demand for that die, and that access operation may be paused as a result. When the wrap-around counter reaches a value corresponding to the counter value assigned to die $100_3$ at time t4, the controller in die $100_3$, assuming its access operation is paused at one of its designated points waiting to perform a high current demand portion, will transition the high current indication signal HC# to a logic low. The high current indication signal HC# may be held low for a subsequent clock cycle of the internal clock signal ICLK, and then released at time t5.

At time t6, die $100_1$ may either still be within the high current demand portion of its access operation resumed at time t2, or may be waiting at another designated point prior to entering a period of high current demand, either in the same access operation or a subsequent access operation. In either case, the controller in die $100_1$ will transition the high current indication signal HC# to a logic low at time t6. The high current indication signal HC# may be held low for a subsequent clock cycle of the internal clock signal ICLK, and then released at time t7. Further at time t8, the ready-busy control signal RB# is transitioned to a logic high, thereby resetting the wrap-around counter.

It is noted that a controller might be configured to cause the transitions of the ready/busy control signal RB# and the high current indication signal HC# as described. For example, the controller might be configured to cause circuitry of the die to transition the ready/busy control signal RB# at the beginning of the access operation, and cause it to be released by the die at the end of the access operation. Similarly, the controller might be configured to cause circuitry of the die to transition the high current indication signal HC# as indicated. It is further noted that while a controller may cause action within its respective die to cause a transition of the ready/busy control signal RB#, the ready/busy control signal RB# may already have the logic level sought by the controller due to action in some other die sharing the ready/busy control signal RB#.

For some embodiments, additional secondary clock cycles of the internal clock signal ICLK might be used to provide an indication of a magnitude of current expected to be consumed by a particular die. For example, a first access operation (or portion of that access operation) might be deemed to have a high level of high current demand, a second access operation (or portion of that access operation) might be deemed to have a medium level of high current demand, and a third access operation (or portion of that access operation) might be deemed to have a low level of high current demand. Units might then be assigned to each access operation, such as three units when a die enters a high current demand portion of the first access operation, two units when the die enters a high current demand portion of the second access operation, and one unit when the die enters a high current demand portion of the third access operation. If used in conjunction with unit assignments by expected differences in current consumption for similar access operations, the unit assignments per die and access operation might be multiplied, for example, to reach a unit consumption for a particular die performing a particular access operation (or portion of that access operation).

Figure 7:
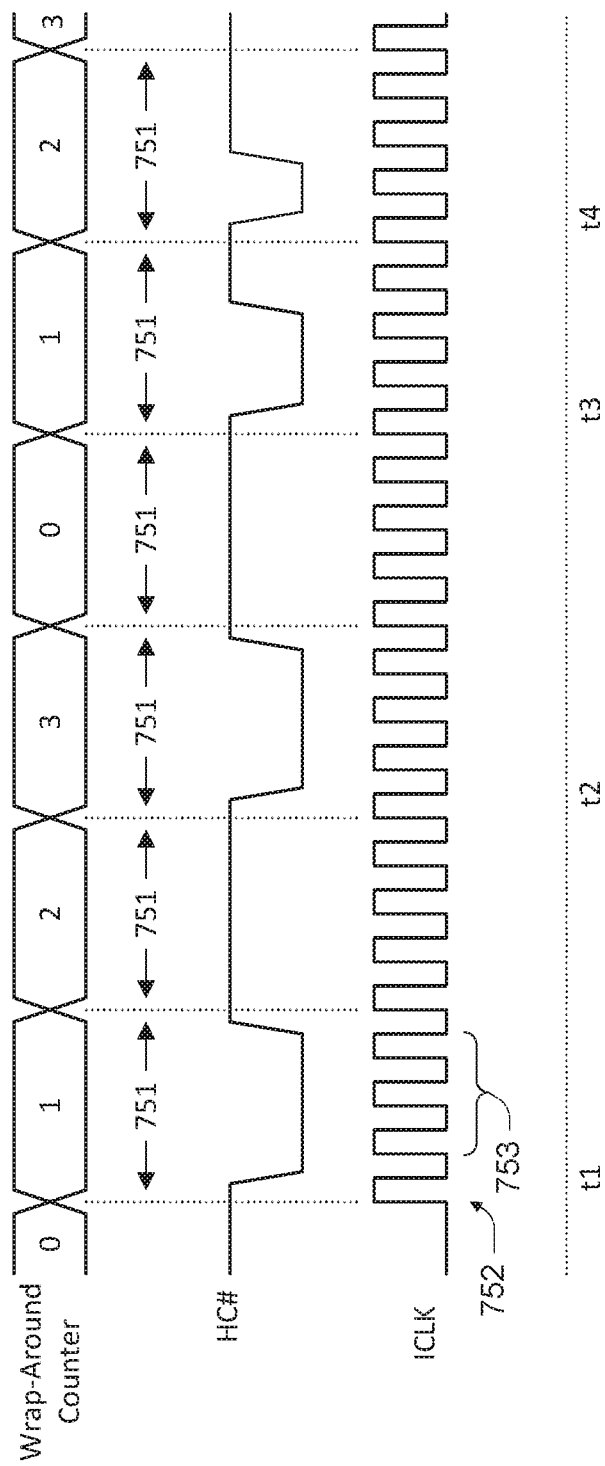
FIG. 7 is another example of a timing diagram showing operation of a multi-die package of the type depicted in FIG. 4a or 4b according to an embodiment.

FIG. 7 is another example of a timing diagram showing operation of a multi-die package of the type depicted in FIG. 4a or 4b according to an embodiment. In this example as well, dies $100_0/100_1/100_2/100_3$ may be assigned the counter values 0/1/2/3, respectively. FIG. 7 depicts an example where a number of secondary clock cycles of the internal clock signal ICLK, during which HC# is active (e.g., pulled low), can be used to indicate a magnitude of expected current consumption. In this example, each count 751 of the wrap-around counter corresponds to a primary clock cycle 752 and a plurality of secondary clock cycles 753. In the example of FIG. 7, there are three secondary clock cycles 753 for each count 751. Each secondary clock cycle 753 might correspond to one unit of consumption if the high current indication signal HC# is logic low. For example, Die1 transitions the high current indication signal HC# to logic low for three secondary clock cycles 753 at time t1 such that remaining dies might add three units of consumption to their tallies of total unit consumption. Die3 transitions the high current indication signal HC# to logic low for three secondary clock cycles 753 at time t2 such that remaining dies might similarly add three units of consumption to their tallies of total unit consumption. At time t3, Die1 transitions the high current indication signal HC# to logic low for two secondary clock cycles 753, indicating that Die1 has entered a subsequent high current demand portion of either its present access operation or a subsequent access operation, and that subsequent high current demand portion has a lower current demand. Remaining dies might add two units of consumption to their tallies of total unit consumption in this instance. Die2 transitions the high current indication signal HC# to logic low for one secondary clock cycles 753 at time t4 such that remaining dies might add one unit of consumption to their tallies of total unit consumption. In each case, if a die has been assigned a unit multiplier, the units of consumption indicated by the number of secondary clock cycles that the high current indication signal HC# is asserted may be multiplied by the corresponding unit multiplier prior to adding to their tallies of total unit consumption.

Figure 8A:
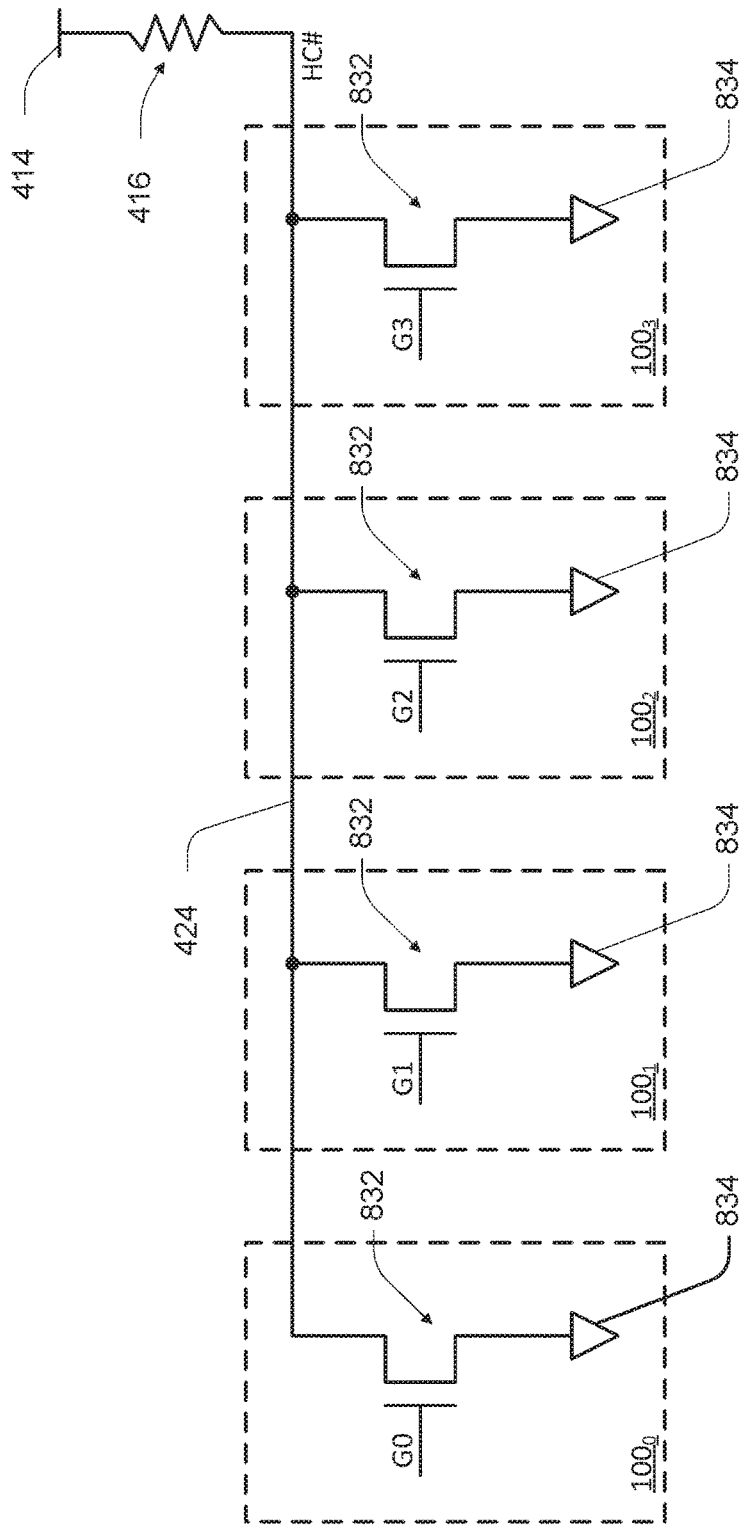
FIG. 8a is a simplified schematic of a circuit for generating a high current indication signal for a multi-die package of the type depicted in FIG. 4a according to an embodiment.

FIG. 8a is a simplified schematic of a circuit for generating the high current indication signal HC# for the type of multi-die package depicted in FIG. 4a according to an embodiment. As depicted in FIG. 8a, four dies $100_0$-$100_3$ commonly share the high current indication signal HC# via high current indication signal node 424. The high current indication signal HC# may be normally pulled to a logic high using voltage supply node 414 and resistor 416, for example. For each of the dies $100_0$-$100_3$, another voltage supply node, such as reference potential node 834 coupled to receive a reference potential, such as a ground or Vss, may be selectively connected to the high current indication signal node 424 through a switch, e.g., a transistor 832, each having a control gate coupled to receive a control signal. For example, die $100_0$ may have the control gate of its transistor 832 coupled to receive the control signal G0, die $100_1$ may have the control gate of its transistor 832 coupled to receive the control signal G1, die $100_2$ may have the control gate of its transistor 832 coupled to receive the control signal G2, and die $100_3$ may have the control gate of its transistor 832 coupled to receive the control signal G3. These control signals are generated (e.g., by the internal controllers of the dies) to activate their respective transistor 832 when their respective die 100 experiences (e.g., is about to enter or has entered) a high current demand portion of an access operation, e.g., in response to a value of the wrap-around counter matching a counter value assigned to that die 100 and the total unit consumption of current determined by that die 100 being less than or equal to the unit limit while an access operation of that die 100 is paused at one of its designated points. As an example, the control signals for the gates of transistors 832 may be normally logic low to deactivate the depicted n-type field-effect transistor (n-FET), and may transition to a logic high responsive to a die 100 experiencing a period of high current demand. These control signals may be held at a logic high for one or more secondary clock cycles of the internal clock signal ICLK to provide an indication of a magnitude of the expected current consumption for their respective dies 100. As such, when a transistor 832 is activated, the voltage level of the high current indication signal node 424 will be pulled to a logic low, and the voltage level of the high current indication signal node 424 will be pulled back to a logic high when none of the transistors 832 are activated.

Figure 8B:
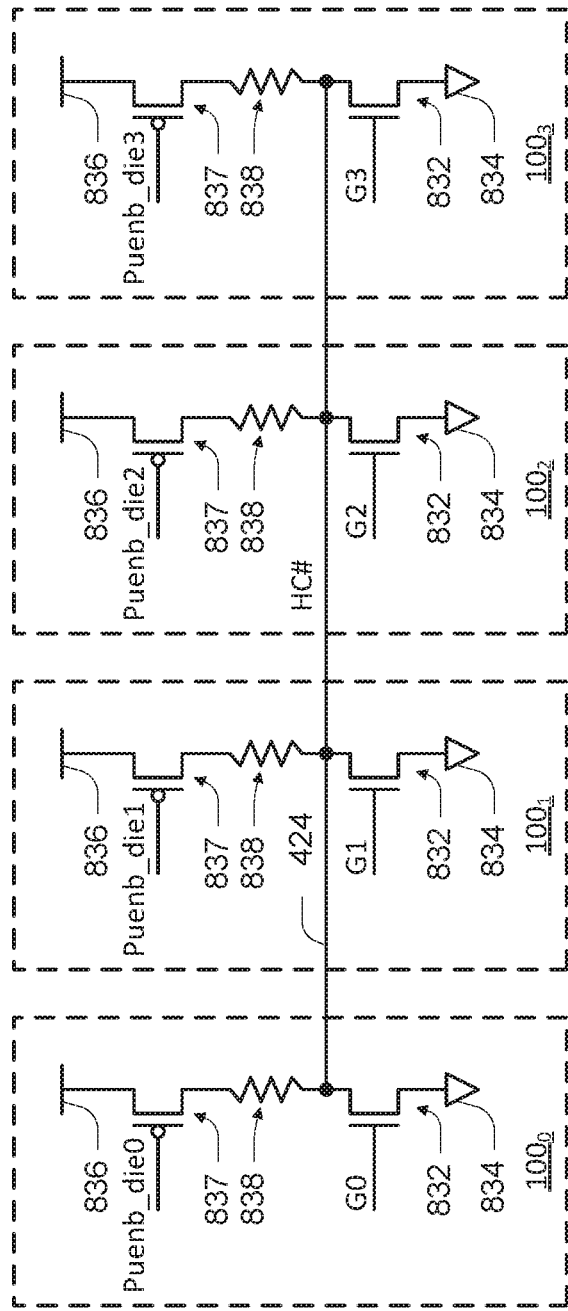
FIG. 8b is a simplified schematic of a circuit for generating a high current indication signal for a multi-die package of the type depicted in FIG. 4b according to an embodiment.

FIG. 8b is a simplified schematic of a circuit for generating the high current indication signal HC# for the type of multi-die package depicted in FIG. 4b according to an embodiment. As depicted in FIG. 8b, four dies $100_0$-$100_3$ commonly share the high current indication signal HC# via high current indication signal node 424. The high current indication signal node 424 is selectively connected to a voltage supply node 836, coupled to receive a supply voltage such as Vcc, through a resistor 838 and a switch, e.g., transistor 837, each transistor 837 having a control gate coupled to receive a control signal. The resistor 838, transistor 837 and voltage supply node 836 may be collectively referred to as a weak pull-up driver, or simply pull-up driver. Die $100_0$ may have the control gate of its transistor 837 coupled to receive the control signal Puenb_die0, die $100_1$ may have the control gate of its transistor 837 coupled to receive the control signal Puenb_die1, die $100_2$ may have the control gate of its transistor 837 coupled to receive the control signal Puenb_die2, and die $100_3$ may have the control gate of its transistor 837 coupled to receive the control signal Puenb_die3. These control signals are generated to deactivate their respective transistor 837 unless they are designated to pull up the high current indication signal HC#. For example, where die $100_0$ is designated to normally pull the high current indication signal HC# high, its control signal Puenb_die0 might be normally low to activate its respective p-type field-effect transistor (p-FET) 837, while the control signals Puenb_die1, Puenb_die2 and Puenb_die3 might be normally high to deactivate their respective transistors 837.

For each of the dies $100_0$-$100_3$, another voltage supply node, such as reference potential node 834, coupled to receive a reference potential such as a ground or Vss, may be selectively connected to the high current indication signal node 424 through a switch, e.g., a transistor 832, each having a control gate coupled to receive a control signal. For example, die $100_0$ may have the control gate of its transistor 832 coupled to receive the control signal G0, die $100_1$ may have the control gate of its transistor 832 coupled to receive the control signal G1, die $100_2$ may have the control gate of its transistor 832 coupled to receive the control signal G2, and die $100_3$ may have the control gate of its transistor 832 coupled to receive the control signal G3. These control signals are generated (e.g., by the internal controllers of the dies) to activate their respective transistor 832 responsive to their respective die 100 experiencing a high current demand portion of an access operation, e.g., in response to a value of the wrap-around counter matching a counter value assigned to that die 100 and the total unit consumption determined by that die 100 being less than or equal to the unit limit while an access operation of that die 100 is paused at one of its designated points. As an example, the control signals for the gates of transistors 832 may be normally logic low to deactivate the depicted n-type field-effect transistor (n-FET), and may transition to a logic high responsive to a die 100 experiencing a period of high current demand. These control signals may be held at a logic high for one or more secondary clock cycles of the internal clock signal ICLK to provide an indication of high current demand for their respective dies 100. As such, when a transistor 832 is activated, the voltage level of the high current indication signal node 424 will be pulled to a logic low, and the voltage level of the high current indication signal node 424 will be pulled back to a logic high when none of the transistors 832 are activated.

Figure 9:
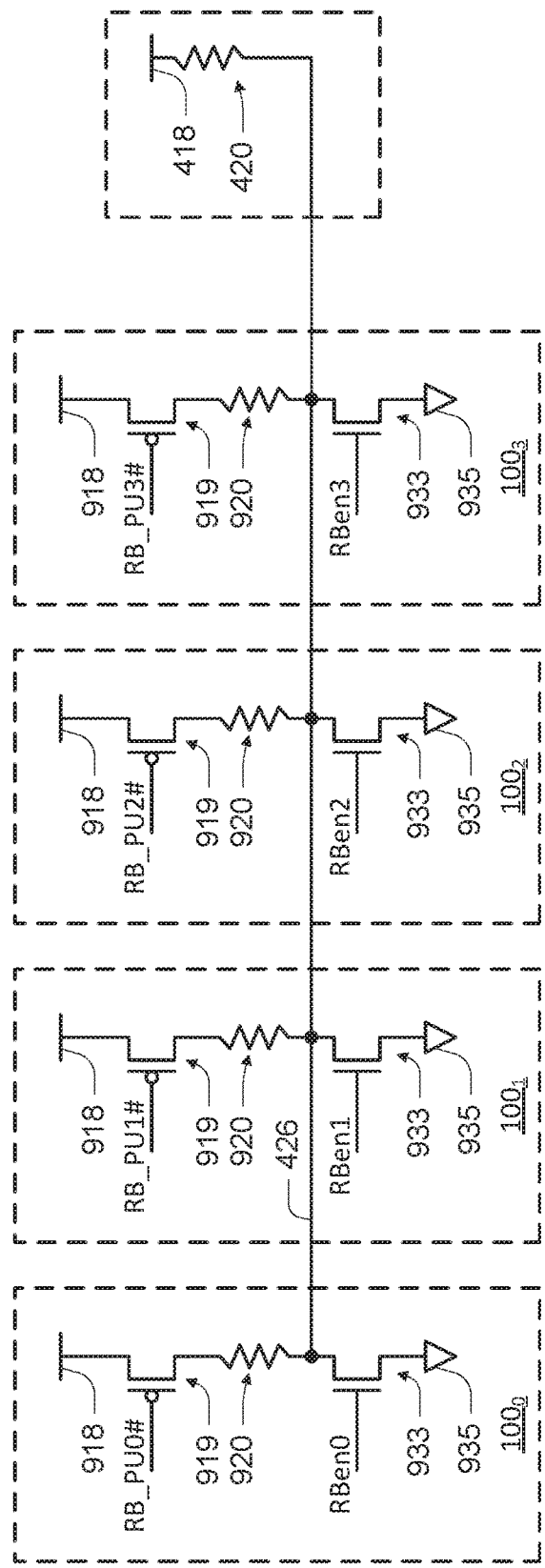
FIG. 9 is a simplified schematic of a circuit for generating a ready/busy control signal for the type of multi-die packages depicted in FIG. 4a or 4b according to an embodiment.

FIG. 9 is a simplified schematic of a circuit for generating the ready/busy control signal RB# for the type of multi-die packages depicted in FIG. 4a or 4b, e.g., whether or not the ready/busy control signal node can be connected to an available pull-up resistor, according to an embodiment. As depicted in FIG. 9, four dies $100_0$-$100_3$ commonly share the ready/busy control signal RB# via ready/busy control signal node 426. The ready/busy control signal node 426 can be connected to an external pull-up resistor, i.e., voltage supply node 418 coupled to receive a supply voltage such as Vcc, and resistor 420. In addition or in the alternative, for each die 100 sharing the ready/busy control signal node 426, the ready/busy control signal node 426 may be selectively connected to a voltage supply node 918, coupled to receive a supply voltage such as Vcc, through a resistor 920 and a switch, e.g., a transistor 919. The resistor 920, transistor 919 and voltage supply node 918 may be collectively referred to as a weak pull-up driver, or simply pull-up driver. Each transistor 919 may have its control gate coupled to receive a control signal. Die $100_0$ may have the control gate of its transistor 919 coupled to receive the control signal RB_PU0#, die $100_1$ may have the control gate of its transistor 919 coupled to receive the control signal RB_PU1#, die $100_2$ may have the control gate of its transistor 919 coupled to receive the control signal RB_PU2#, and die $100_3$ may have the control gate of its transistor 919 coupled to receive the control signal RB_PU3#. These control signals are generated to deactivate their respective transistor 919 unless they are designated to pull up the ready/busy control signal RB#, such as in the case where no pull-up transistor (e.g., voltage supply node 418 and resistor 420) is available external to the dies 100. For example, where die $100_0$ is designated to normally pull the ready/busy control signal RB# high, its control signal RB_PU0# might be normally low to activate its respective p-type field-effect transistor (p-FET) 919, while the control signals RB_PU1#, RB_PU2# and RB_PU3# might be normally high to deactivate their respective transistors 919. In cases where a pull-up transistor is available to the ready/busy control signal node 426 external to the dies 100, each of the transistors 919 might be deactivated.

For each of the dies $100_0$-$100_3$, another voltage supply node, such as reference potential node 935, coupled to receive a reference potential such as a ground or Vss, may be selectively connected to the ready/busy control signal node 426 through a switch, e.g., a transistor 933, each having a control gate coupled to receive a control signal. For example, die $100_0$ may have the control gate of its transistor 933 coupled to receive the control signal RBen0, die $100_1$ may have the control gate of its transistor 933 coupled to receive the control signal RBen1, die $100_2$ may have the control gate of its transistor 933 coupled to receive the control signal RBen2, and die $100_3$ may have the control gate of its transistor 933 coupled to receive the control signal RBen3. These control signals are generated to activate their respective transistor 933 when their respective die 100 is busy, e.g., during periods of an access operation. As an example, the control signals for the gates of transistors 933 may be normally logic low to deactivate the depicted n-FET, and may transition to a logic high when an access operation is initiated, and may return to a logic low when the access operation is completed. As such, when a transistor 933 is activated, the voltage level of the ready/busy control signal node 426 will be pulled to a logic low, and the voltage level of the ready/busy control signal node 426 will be pulled back to a logic high when none of the transistors 933 are activated. For some embodiments, the die 100 designated to normally pull the ready/busy control signal RB# high may disable its pull-up driver when any of the dies 100 sharing the ready/busy control signal RB# is in a period of high current demand, e.g., when any of the control signals RBen0-RBen3 of FIG. 17 have a logic level to activate their respective transistors 933. To avoid the ready/busy control signal RB# floating before one of the transistors 919 is activated, each transistor 919 of a die 100 sharing the ready/busy control signal RB# may be activated during power-up of the dies 100, then deactivated after completion of the power-up routine. During this period, the transistors 933 of these dies 100 remain deactivated.

Figure 10A:
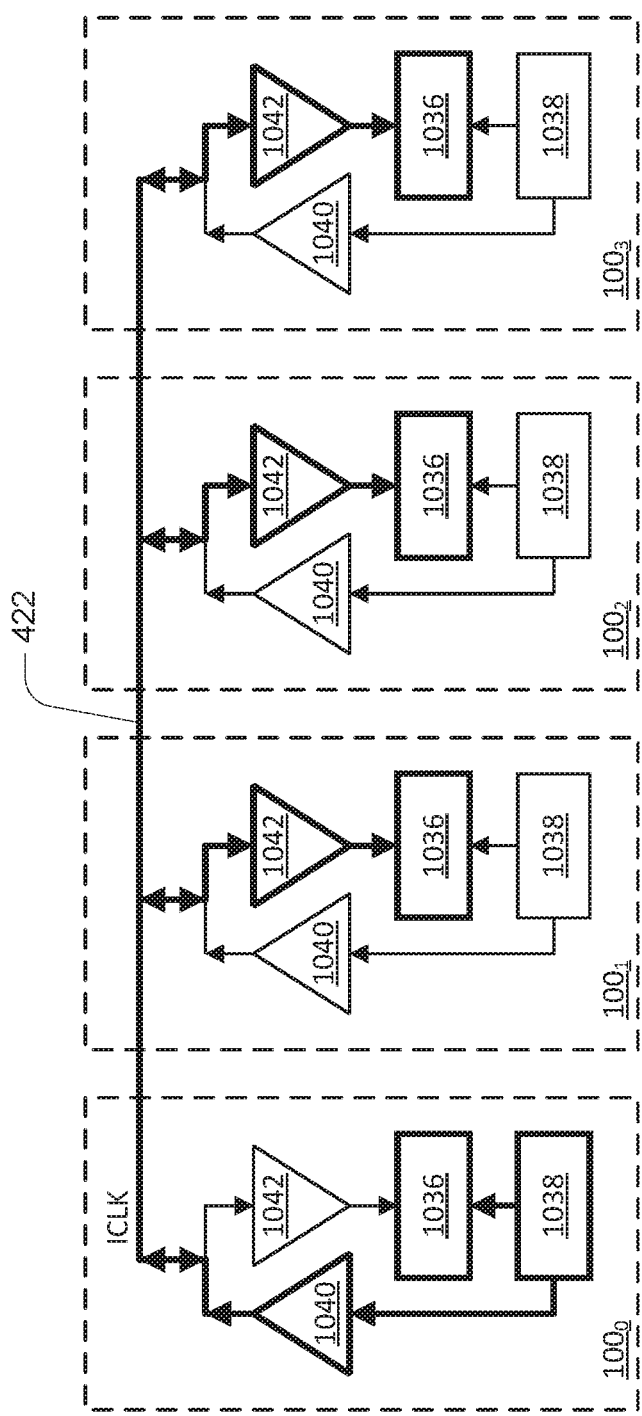
FIG. 10a is a simplified schematic of a circuit for generating an internal clock signal and a count of a wrap-around counter according to an embodiment.

FIG. 10a is a simplified schematic of a circuit for generating the internal clock signal ICLK and the count of the wrap-around counter according to an embodiment. As depicted in FIG. 10a, four dies $100_0$-$100_3$ commonly share the clock signal ICLK via clock signal node 422. Each die 100 is depicted to include a clock counter (e.g., wrap-around counter) 1036, a clock generator 1038, an output buffer 1040 and an input buffer 1042. The output buffer 1040 (e.g., a clock output) has its output connected to the clock signal node 422, while the input buffer 1042 has its input connected to the clock signal node 422. The bolded sections denote portions of the circuits that may be active for each of the respective dies $100_0$-$100_3$ while the ready/busy control signal RB# is logic low, for some embodiments even if any of the dies $100_0$-$100_3$ is in standby mode. For the example of FIG. 10a, die $100_0$ is designated for providing (e.g., generating) the clock signal ICLK, while the clock generators 1038 for the remaining dies 100 are inactive.

Each of the wrap-around counters 1036 is connected to receive a clock signal ICLK either directly from its corresponding clock generator 1038, such as in the case of die $100_0$, or from its input buffer 1042, such as in the case of dies $100_1$-$100_3$. In this manner, each of the wrap-around counters 1036 may remain synched as each is operating from the same clock signal ICLK, i.e., the clock signal ICLK generated by the clock generator 1038 of die $100_0$.

Figure 10B:
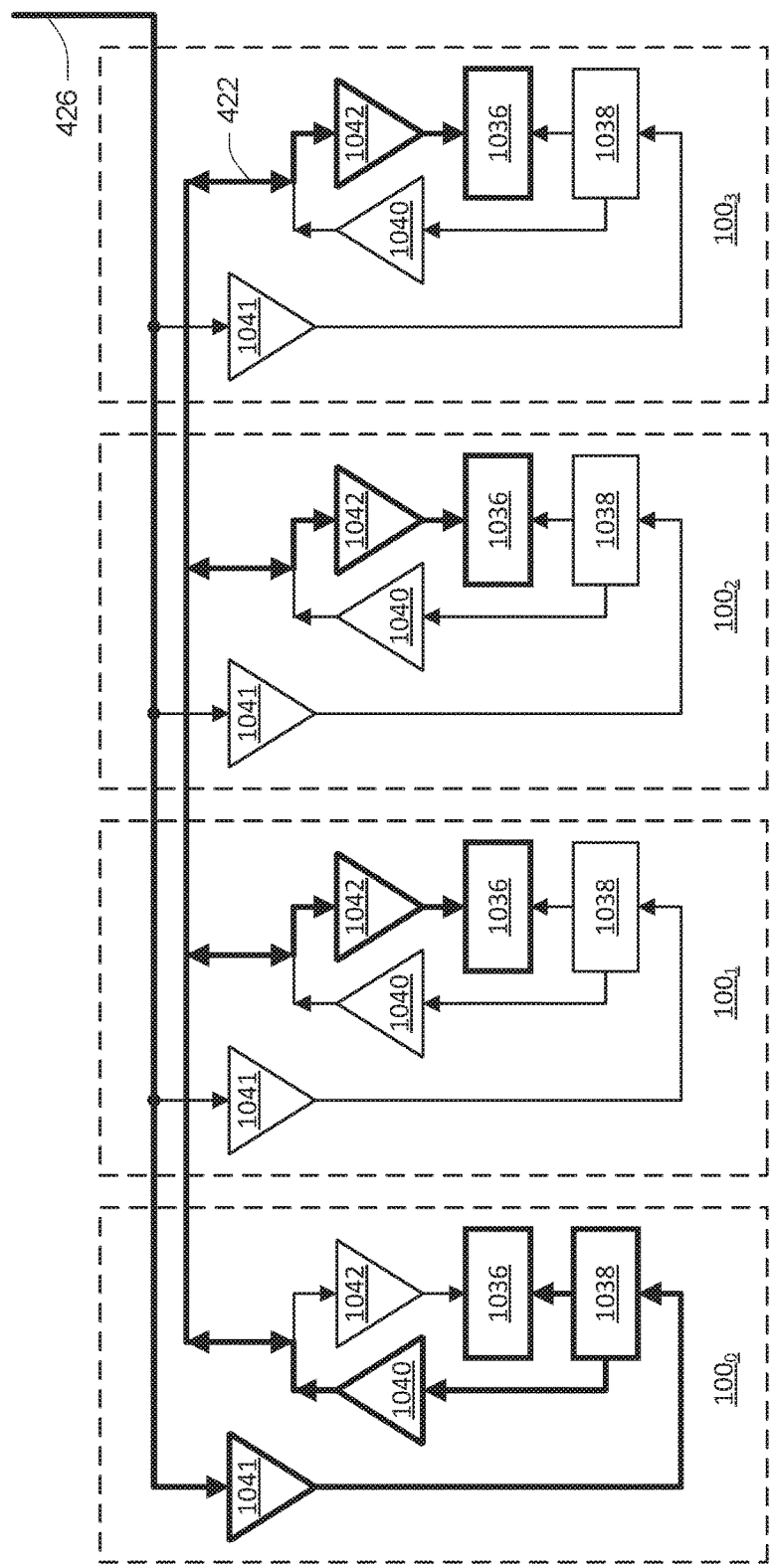
FIG. 10b is a simplified schematic of a circuit for generating an internal clock signal and a count of a wrap-around counter according to another embodiment.

FIG. 10b is a simplified schematic of a circuit for generating the internal clock signal ICLK and the count of the wrap-around counter showing an example of using the ready/busy control signal RB# to enable the clock generator according to an embodiment. As depicted in FIG. 10b, four dies $100_0$-$100_3$ commonly share the clock signal ICLK via clock signal node 422. Each die 100 is depicted to include a clock counter (i.e., wrap-around counter) 1036, a clock generator 1038, an output buffer 1040 and an input buffer 1042. The output buffer 1040 has its output connected to the clock signal node 422, while the input buffer 1042 has its input connected to the clock signal node 422. Each die 100 is further depicted to include an input buffer 1041 having its input connected to the ready/busy control signal node 426 and its output connected to the clock generator 1038. The clock generator 1038 may utilize the output of the buffer 1041 as an enable signal, i.e., generating the clock signal ICLK if the output of the buffer 1041 has a first logic level, such as logic low, and stopping generation of the clock signal ICLK if the output of the buffer 1041 has a second logic level, such as logic high. Although not shown in FIG. 10b, the output of the buffer 1041 might be connected to the wrap-around counter 1036 to reset the value of the wrap-around counter 1036 (e.g., reset to zero), when the output of the buffer 1041, and thus the ready/busy control signal RB#, is a logic high.

The bolded sections of FIG. 10b denote portions of the circuits that may be active for each of the respective dies $100_0$-$100_3$ while the ready/busy control signal RB# is logic low, for some embodiments even if any of the dies $100_0$-$100_3$ is in standby mode. For the example of FIG. 10b, die $100_0$ is designated for generating the clock signal ICLK, while the clock generators 1038 for the remaining dies 100 are inactive. Each of the wrap-around counters 1036 is connected to receive a clock signal ICLK either directly from its corresponding clock generator 1038, such as in the case of die $100_0$, or from its input buffer 1042, such as in the case of dies $100_1$-$100_3$. In this manner, each of the wrap-around counters 1036 may remain synched as each is operating from the same clock signal ICLK, i.e., the clock signal ICLK generated by the clock generator 1038 of die $100_0$.

Figure 11:
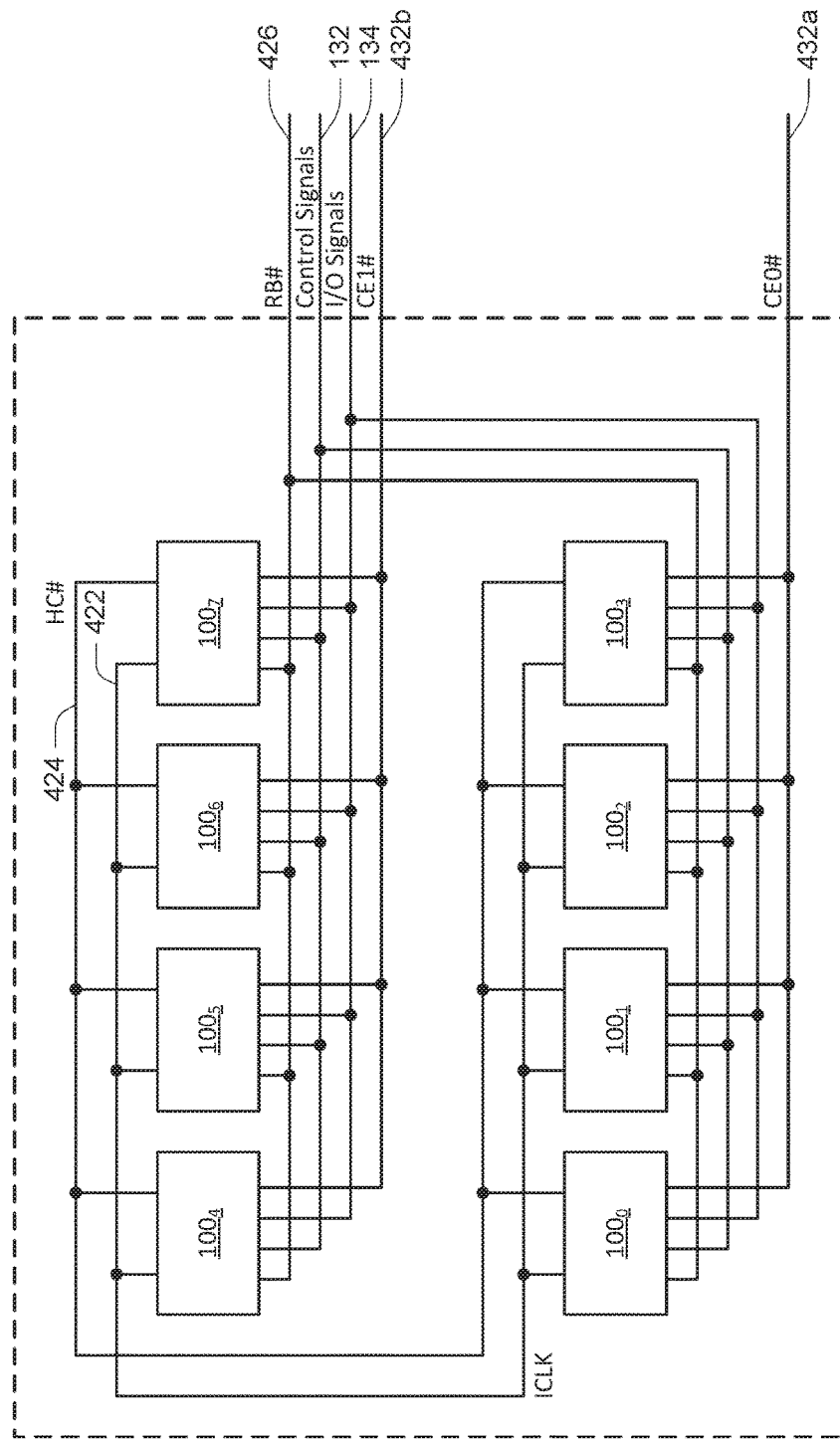
FIG. 11 is a schematic representation of a multi-die package according to an embodiment.

FIG. 11 is a schematic representation of a multi-die package including eight dies 100 (e.g., $100_0$-$100_7$) according to an embodiment. The clock signal ICLK is commonly shared between the dies 100 through a clock signal node 422. Dies $100_0$-$100_7$ might be part of a package 302. Dies $100_0$-$100_3$ might be selectively enabled in response to a chip enable signal CE0# through chip-enable signal node 432a. Dies $100_4$-$100_7$ might be selectively enabled in response to a chip enable signal CE1# through chip-enable signal node 432b.

One of the dies $100_0$-$100_3$ might be designated to provide the clock signal ICLK, e.g., in response to the ready/busy control signal RB#, and one of the dies $100_4$-$100_7$ might also be designated to provide the clock signal ICLK, e.g., in response to the ready/busy control signal RB#. The high current indication signal HC# is commonly shared between the dies 100 through a high current indication signal node 424. The high current indication signal HC# may be normally pulled to a particular state (e.g., pulled high). The ready/busy control signal RB# is commonly shared between the dies 100 through a ready/busy control signal node 426. The ready/busy control signal RB# may be normally pulled to a particular state (e.g., pulled high). Each of the dies 100 is further commonly connected to a control link 132 and to an I/O bus 134. For such an example, wrap-around counters for each of the dies 100 might count from 0 to 7, even though some of the dies 100 might be disabled from accepting commands in response to their respective chip enable signal. It is noted that even when a die 100 is disabled from accepting commands, it may still perform power management according to various embodiments, such as while performing an access operation in response to a command received before its chip enable signal was transitioned high.

Figure 12:
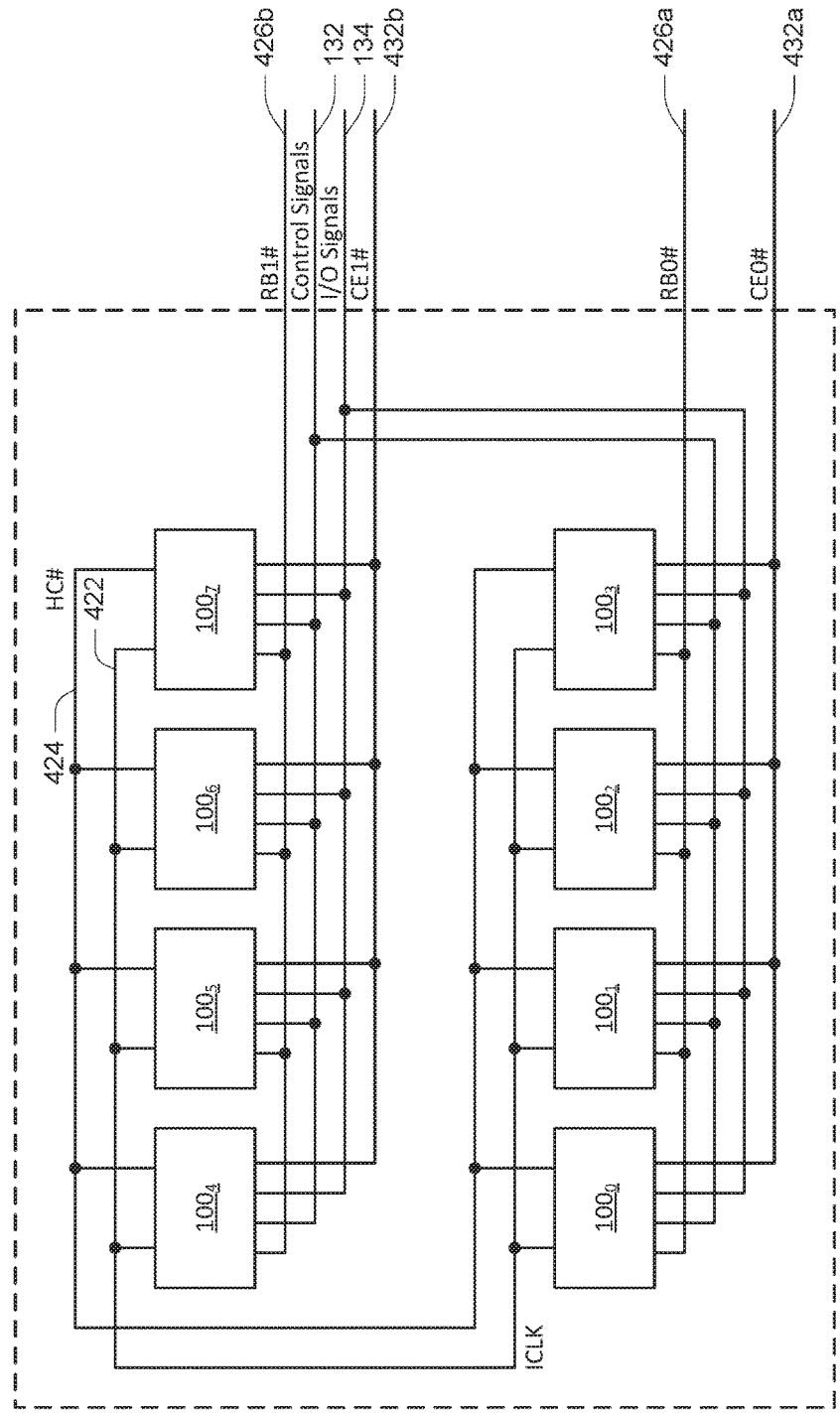
FIG. 12 is a schematic representation of a multi-die package according to another embodiment.

FIG. 12 is a schematic representation of a multi-die package including eight dies 100 (e.g., $100_0$-$100_7$) according to another embodiment. The clock signal ICLK is commonly shared between the dies 100 through a clock signal node 422. Dies $100_0$-$100_7$ might be part of a package 302. Dies $100_0$-$100_3$ might be selectively enabled in response to a chip enable signal CE0# through chip-enable signal node 432a. Dies $100_4$-$100_7$ might be selectively enabled in response to a chip enable signal CE1# through chip-enable signal node 432b.

One of the dies $100_0$-$100_3$ might be designated to provide the clock signal ICLK, e.g., in response to a ready/busy control signal RB0#, and one of the dies $100_4$-$100_7$ might also be designated to provide the clock signal ICLK, e.g., in response to a ready/busy control signal RB#. The high current indication signal HC# is commonly shared between the dies 100 through a high current indication signal node 424. The high current indication signal HC# may be normally pulled to a particular state (e.g., pulled high). The ready/busy control signal RB0# is commonly shared between the dies $100_0$-$100_3$ through a ready/busy control signal node 426a. The ready/busy control signal RB1# is commonly shared between the dies $100_4$-$100_7$ through a ready/busy control signal node 426b. The ready/busy control signals RB0# and RB1# may be normally pulled to a particular state (e.g., pulled high). Each of the dies 100 is further commonly connected to a control link 132 and to an I/O bus 134. For such an example, wrap-around counters for each of the dies 100 might count from 0 to 7, even though some of the dies 100 might be disabled from accepting commands in response to their respective chip enable signal. It is noted that even when a die 100 is disabled from accepting commands, it may still perform power management according to various embodiments, such as while performing an access operation in response to a command received before its chip enable signal was transitioned high.

For the multi-die packages of FIGS. 11 and 12, it may be desired that only one die 100 provide (e.g., generate) the internal clock signal ICLK at any given time. For example, where die $100_0$ and die $100_4$ are designated as the default dies for providing the internal clock signal ICLK, it might be desirable if only one of those dies were to provide the internal clock signal ICLK if both ready/busy control signals RB0# and RB1# were transitioned low. As such, each die 100 designated to provide the internal clock signal ICLK might first determine whether the internal clock signal ICLK is already active prior to providing its own clock signal.

As two dies 100 designated to provide the internal clock signal ICLK might seek to provide their clock signals simultaneously, each such die 100 might be assigned a different delay before starting its own clock generator. For the foregoing example, die $100_0$ might wait for X clock cycles of a system clock before starting its own clock generator and die $100_4$ might wait for Y clock cycles of the system clock before starting its own clock generator, where X and Y are different integer values. The difference between X and Y might be such that if one die starts its clock generator, the other die has sufficient time to detect activity of the internal clock signal ICLK before its delay is reached.

The delays may each be longer than one cycle of the internal clock signal ICLK to allow for detection. To further mitigate the situation where two dies seek to generate the internal clock signal ICLK simultaneously, each die generating the internal clock signal ICLK might be configured to stop its clock generator if an improper frequency of the internal clock signal ICLK is detected (e.g., a frequency that is too high), and reinitiate their respective delays and check for activity before restarting their clock generators.

Figure 13:
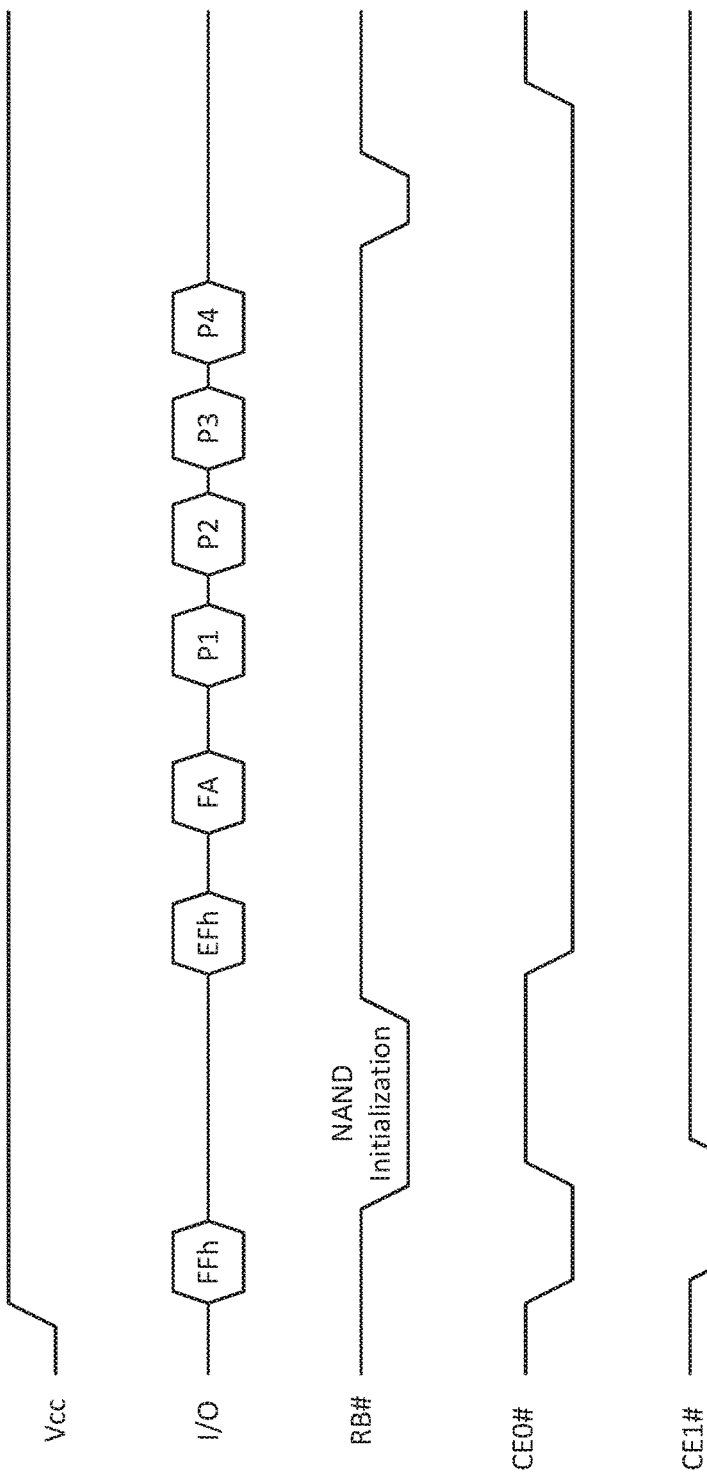
FIG. 13 is a timing diagram showing conceptually how particular dies might be designated to provide their respective clock signals for a multi-die package of the type depicted in FIG. 11 or 12 according to an embodiment.

While multiple dies might be designated to provide the internal clock signal ICLK in some embodiments, other embodiments may designate only one die to provide the internal clock signal ICLK. FIG. 13 is a timing diagram showing conceptually how only a particular die 100, such as one of the dies $100_0$-$100_7$ of FIG. 11 or 12, might be designated to provide the clock signal ICLK according to an embodiment. For example, upon application of power (e.g., Vcc), each of the chip enable signals CE0# and CE1# might be transitioned low, to enable the dies 100 to receive commands and parameters. An initialization command (e.g., FFh) might be provided to begin an initialization routine on each of the dies 100. After the initialization routines are complete, the chip enable signal CE0# of a subset of the dies 100, e.g., dies $100_0$-$100_3$, might again be transitioned low while the remaining chip enable signal CE1# of a different subset of the dies 100, e.g., dies $100_4$-$100_7$, might remain high, thereby enabling dies $100_0$-$100_3$ to receive commands and parameters without affecting dies $100_4$-$100_7$. Subsequently, a set feature command (EFh), a feature address (FA) and one or more parameters (e.g., P1-P4) might indicate to a particular die 100 designated by the feature address, e.g., die $100_0$, that it is to provide the internal clock signal ICLK, and activate the corresponding circuitry to do so (e.g., activate the bolded circuitry of die $100_0$ of FIG. 10a or 10b). Remaining dies 100, e.g., dies $100_1$-$100_7$, might default to not provide a clock signal, but instead activate the corresponding circuitry to receive the internal clock signal ICLK from the clock signal node 422 (e.g., activate the bolded circuitry of dies $100_1$-$100_3$ of FIG. 10a or 10b).

Fewer or more parameter values might be used, depending upon the level of detail of parameter options to pass to the dies 100. For one example, parameter options might include whether to enable or disable peak power management (PPM), what number of dies share the internal clock signal ICLK (e.g., logical unit numbers or LUNs), whether the ready/busy signal is to be pulled up internal to the device or by an external pull-up driver, what access operations are subject to power management, what value to assign the unit limit, whether to enable or disable the clock generator, what mapping to use for the addressed die (e.g., what counter value to assign), and whether mapping is enabled (e.g., might be disabled after first mapping is set). Tables 1 and 2 show example values for these parameter options that might be provided to the die corresponding to the feature address of the set feature command during first and second parameter data cycles, respectively.

TABLE 1

Parameter Option Values—First Data Cycle

| Enable/Disable PPM | Disable PM | | | 0 |
|---|---|---|---|---|
| | Enable PM | | | 1 |
| Number of LUNs | 2 | | 0 | 0 |
| | 4 | | 0 | 1 |
| | 8 | | 1 | 0 |
| | 16 | | 1 | 1 |

TABLE 1-continued

Parameter Option Values—First Data Cycle

| RB Pull-Up | External | | | 0 |
|---|---|---|---|---|
| | Internal | | | 1 |
| PM Access Operations | Write Op | | 0 | |
| | Write and Erase Ops | | 1 | |
| Unit Limit | 1 | 0 | 0 | X |
| | 2 | 0 | 1 | 0 |
| | 3 | 0 | 1 | 1 |
| | 4 | 1 | 0 | 0 |
| | 5 | 1 | 0 | 1 |
| | 6 | 1 | 1 | 0 |
| | 7 | 1 | 1 | 1 |

TABLE 2

Parameter Option Values—Second Data Cycle

| Enable/Disable Clock | Disable | | | | 0 |
|---|---|---|---|---|---|
| | Enable | | | | 1 |
| LUN Mapping | 0000 | 0 | 0 | 0 | 0 |
| | 0001 | 0 | 0 | 0 | 1 |
| | 0010 | 0 | 0 | 1 | 0 |
| | 0011 | 0 | 0 | 1 | 1 |
| | 0100 | 0 | 1 | 0 | 0 |
| | 0101 | 0 | 1 | 0 | 1 |
| | 0110 | 0 | 1 | 1 | 0 |
| | 0111 | 0 | 1 | 1 | 1 |
| | 1000 | 1 | 0 | 0 | 0 |
| | 1001 | 1 | 0 | 0 | 1 |
| | 1010 | 1 | 0 | 1 | 0 |
| | 1011 | 1 | 0 | 1 | 1 |
| | 1100 | 1 | 1 | 0 | 0 |
| | 1101 | 1 | 1 | 0 | 1 |
| | 1110 | 1 | 1 | 1 | 0 |
| | 1111 | 1 | 1 | 1 | 1 |
| Enable Mapping | Disable | 0 | | | |
| | Enable | 1 | | | |

Although the foregoing example showed conceptually how one die might be designated to provide the internal clock signal ICLK, a similar process could also be used to designate more than one die to provide the internal clock signal ICLK. Furthermore, a command could be provided to start and/or stop the clock generator of a particular die, regardless of a value of a ready/busy control signal. Such a command might be used to provide the internal clock signal ICLK on a designated die before any array operations are requested. For example, if it is desired to use die $100_0$ of FIG. 12 to provide the internal clock signal ICLK for dies $100_0$-$100_7$, RB0# might not yet have transitioned low if no die $100_0$-$100_3$ is busy, but one or more of the dies $100_4$-$100_7$ might be busy. Thus, it may be desirable to start the clock generator on die $100_0$, in order for the dies $100_0$-$100_7$ to participate in power management, regardless of the value of the ready/busy signal RB0#.

Figure 14:
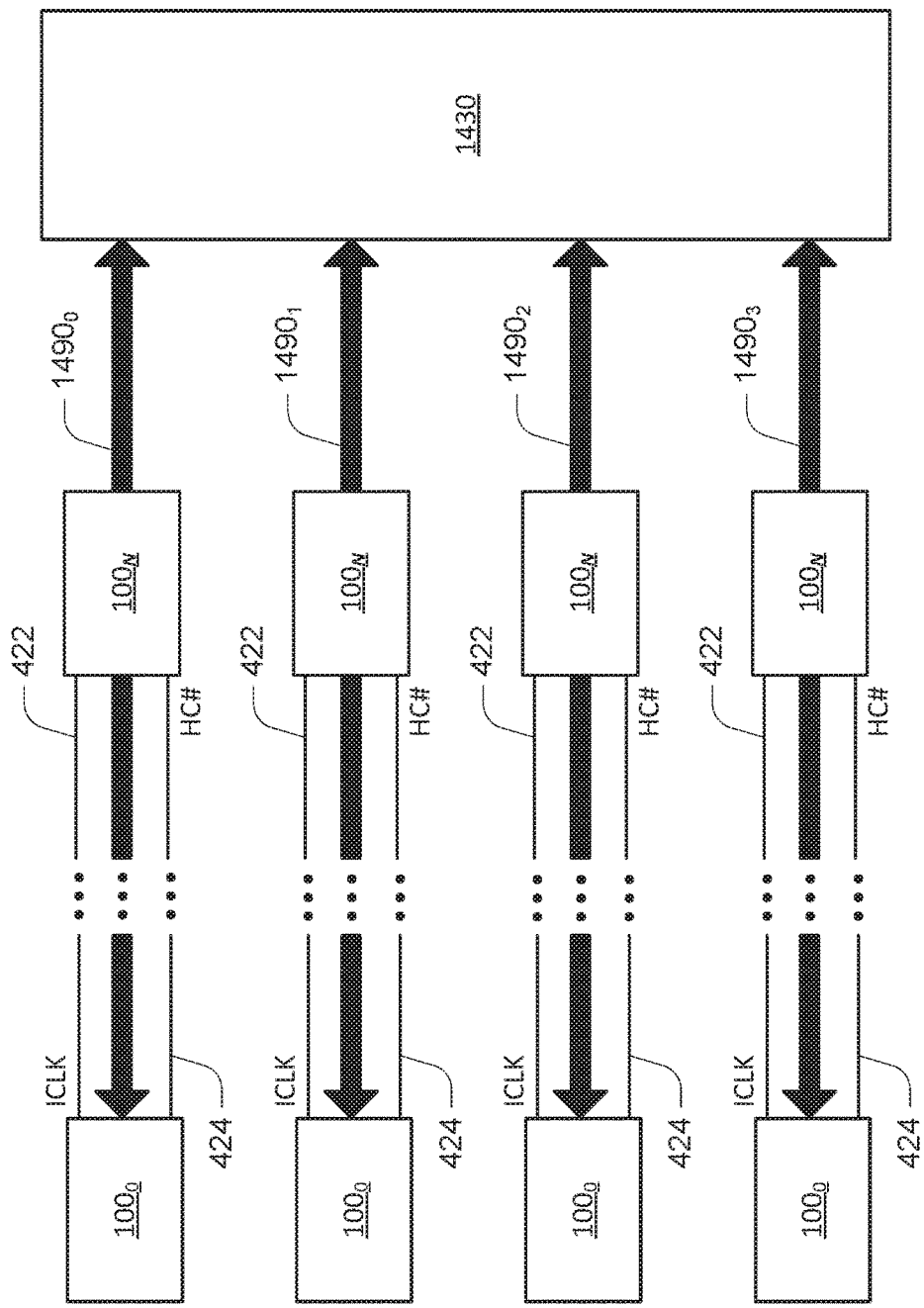
FIG. 14 is a simplified block diagram of a of an electronic system having multiple channels according to another embodiment.

FIG. 14 is a simplified block diagram of a of an electronic system having multiple channels according to another embodiment. Some systems may utilize multiple channels to communicate with multiple dies 100, to improve performance, for example. FIG. 14 depicts a system having four channels 1490 (i.e., channels $1490_0$, $1490_1$, $1490_2$ and $1490_3$). Fewer or more channels 1490 are possible. Each channel 1490 is depicted to include N dies 100. While each channel 1490 is depicted to include the same number of dies 100, each channel 1490 could have differing numbers of dies 100, for example. The channels 1490 may represent communications channels between the dies 100 and an external controller 1430. For example, each channel 1490 may include a control link 132 and I/O bus 134 as discussed with reference to FIG. 1. For embodiments utilizing multiple channels, the system may vary the unit limit for each channel, and may disable peak power management for one or more of the channels as well. For example, channel $1490_3$ may be coupled to one or more dies 100 for storage of archival data, such that performance might be deemed a low priority. In this case, the system (e.g., controller 1430) could assign a low unit limit (e.g., allowing only one die 100 coupled to channel $1490_3$ to experience a period of high current demand at one time) to the dies 100 coupled to channel $1490_3$. In contrast, the system may disable peak power management entirely for the dies 100 coupled to channel $1490_0$ if access speed is deemed to be more critical than power management for those dies 100. Furthermore, the system might assign other unit limits to the dies 100 coupled to channels $1490_1$ and $1490_2$ to maintain its overall power budget.

Figure 15:
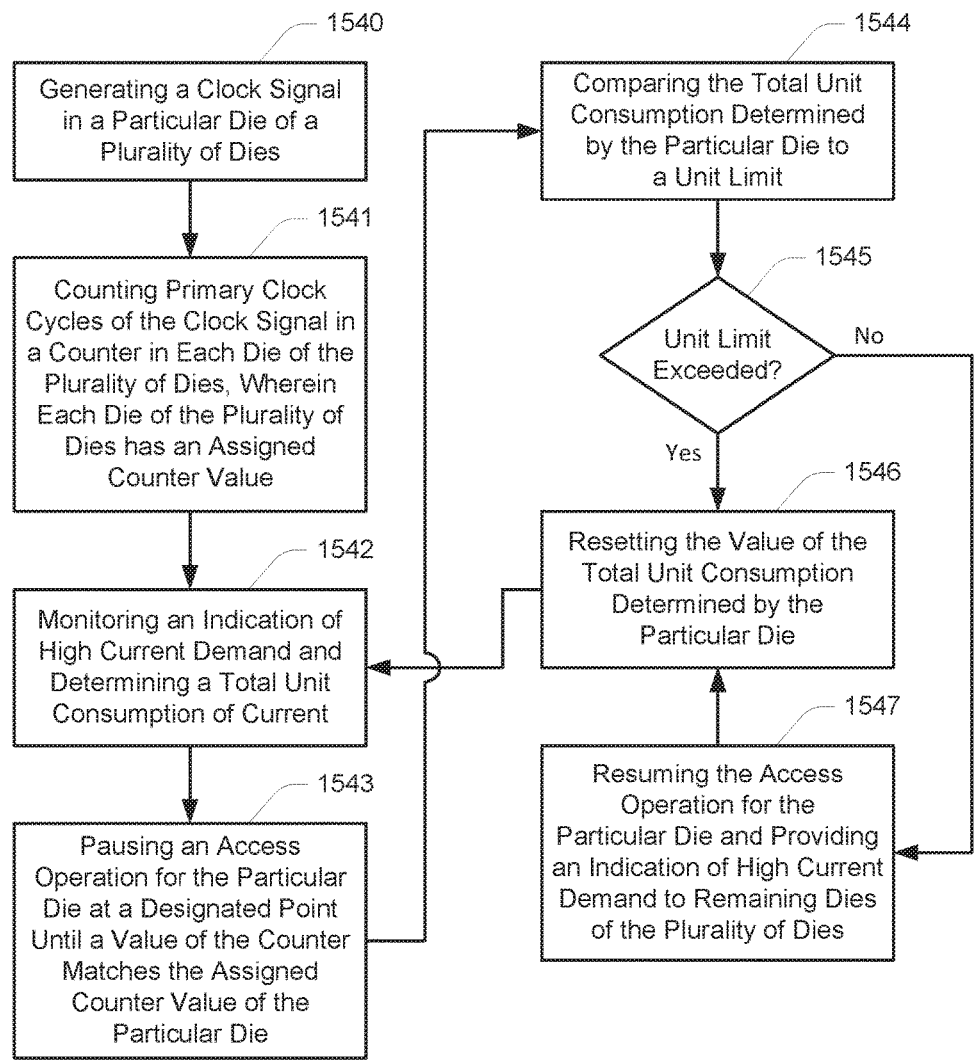
FIG. 15 is a flowchart of a method of operating a plurality of dies according to an embodiment.

FIG. 15 is a flowchart of a method of operating a plurality of dies according to an embodiment. At 1540, a clock signal is generated in a particular die of the plurality of dies. The plurality of dies commonly share the clock signal, e.g., the internal clock signal ICLK. At 1541, cycles (e.g., primary cycles) of the clock signal are counted in a counter (e.g., a wrap-around counter) in each die of the plurality of dies. Each die of the plurality of dies has an assigned counter value. For example, in a multi-die package containing N dies, counter values of 0 through N−1 might be assigned, one value to each die without repetition. As such, a wrap-around counter might count from a first value, e.g., 0, to a last value, e.g., N−1, and then return to the first value on the next clock signal. At 1542, the particular die monitors an indication of high current demand (e.g., to determine a unit consumption of current for each value of the counter) and determines a total unit consumption. At 1543, an access operation for the particular die of the plurality of dies is paused at a designated point until a value of the counter matches the assigned counter value of the particular die.

When the count value of the counter matches the assigned counter value of the particular die, the particular die compares total unit consumption, as determined by the particular die, to a unit limit at 1544. If the unit limit is exceeded at 1545, the method proceeds to 1546 and resets the total unit consumption value determined by the particular die. The method then returns to 1542 to monitor an indication of high current demand and determine a total unit consumption. If the unit limit is not exceeded at 1545, i.e., the total unit consumption is less than or equal to the unit limit, the method proceeds to 1547 and resumes the access operation of the particular die and provides an indication of high current demand (e.g., an indication that the particular die is experiencing a high current demand portion of an operation) to remaining dies of the plurality of dies. The method then proceeds to 1546 and resets the value of the total unit consumption determined by the particular die. Although FIG. 15 depicts a particular order in this example, some acts could be performed concurrently or in a different order. For example, resetting of the value of the total unit consumption determined by the particular die at 1546 could alternatively be performed before resuming the access operation at 1547 or concurrently with resuming the access operation at 1547.

Figure 16:
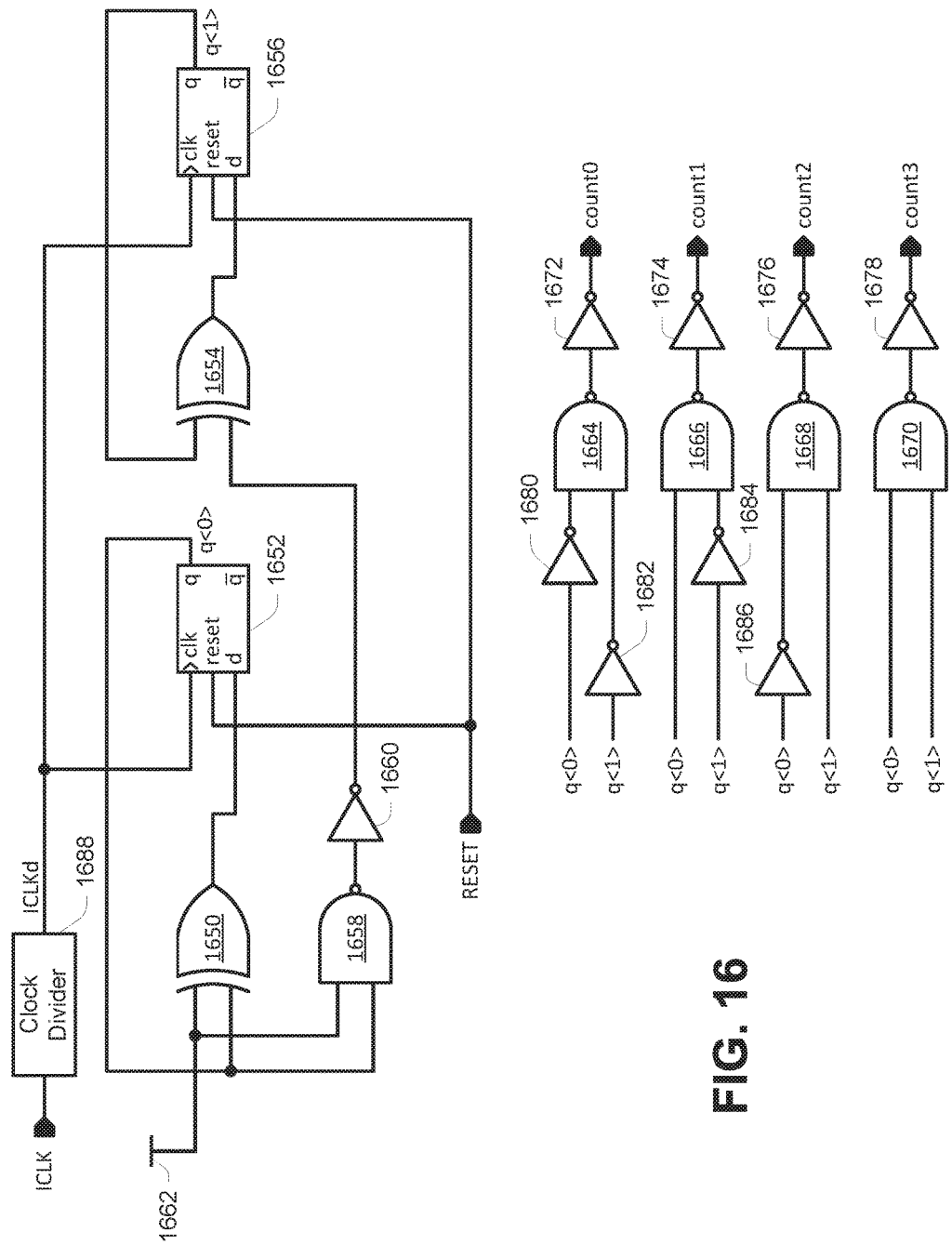
FIG. 16 is a schematic of a wrap-around counter according to an embodiment.

FIG. 16 is a schematic of a wrap-around counter according to an embodiment. The wrap-around counter includes a clock divider 1658 coupled to receive the internal clock signal ICLK at its input and to provide a divided internal clock signal ICLKd at its output. The clock divider 1658 is configured to provide the divided internal clock signal ICLKd to have one clock cycle for each primary clock cycle of the internal clock signal ICLK. In this manner, the wrap-around counter may provide a count corresponding to each primary clock cycle of the internal clock signal ICLK while ignoring secondary clock cycles of the internal clock signal ICLK.

The wrap-around counter includes an XOR gate 1650 having its output coupled to the control input (e.g., d input) of a D flip-flop 1652, a first input coupled to a supply node 1662 to receive a supply voltage, e.g., Vcc, and a second input coupled to the output (e.g., a normal output or q output) of the D flip-flop 1652. The D flip-flop 1652 might be a rising edge triggered D flip-flop, for example. The inverted output or q-bar output of the D flip-flop 1652 may be unused. The D flip-flop 1652 has its clock input coupled to receive the divided internal clock signal ICLKd, and is further coupled to receive a RESET signal. The RESET signal may represent the ready/busy control signal RB#. The wrap-around counter further includes a NAND gate 1658 having a first input coupled to the first input of the XOR gate 1650, a second input coupled to the second input of the XOR gate 1650, and an output coupled to the input of an inverter 1660. The wrap-around counter further includes an XOR gate 1654 having its output coupled to the control input (e.g., d input) of a D flip-flop 1656, a first input coupled to the output (e.g., normal output or q output) of the D flip-flop 1656, and a second input coupled to the output of the inverter 1660. The D flip-flop 1656 might be a rising edge triggered D flip-flop, for example. The inverted output or q-bar output of the D flip-flop 1652 may be unused. The D flip-flop 1656 has its clock input coupled to receive the divided internal clock signal ICLKd, and is further coupled to receive the RESET signal. The output of the D flip-flop 1652 represents the signal q<0> while the output of the D flip-flop 1656 represents the signal q<1>.

The wrap-around counter of FIG. 16 represents a 2-bit wrap-around counter, providing values of 0 to 3, for example. The signals q<0> and q<1> of the wrap-around counter may be combined to generate signals representative of the value of the wrap-around counter. For example, the wrap-around counter may further include an inverter 1672 providing a count0 signal at its output, and having its input coupled to the output of a NAND gate 1664. The NAND gate 1664 has a first input coupled to the output of an inverter 1680, and a second input coupled to the output of an inverter 1682. The inverter 1680 has its input coupled to receive the q<0> signal, while the inverter 1682 has its input coupled to receive the q<1> signal. The count0 signal may represent a counter value of 0 when it has a particular logic level, e.g., a logic high. The wrap-around counter may further include an inverter 1674 providing a count1 signal at its output, and having its input coupled to the output of a NAND gate 1666. The NAND gate 1666 has a first input coupled to receive the q<0> signal, and a second input coupled to the output of an inverter 1684. The inverter 1684 has its input coupled to receive the q<1> signal. The count1 signal may represent a counter value of 1 when it has a particular logic level, e.g., a logic high. The wrap-around counter may further include an inverter 1676 providing a count2 signal at its output, and having its input coupled to the output of a NAND gate 1668. The NAND gate 1668 has a first input coupled to the output of an inverter 1686, and a second input coupled to receive the q<1> signal. The inverter 1686 has its input coupled to receive the q<0> signal. The count2 signal may represent a counter value of 2 when it has a particular logic level, e.g., a logic high. The wrap-around counter may further include an inverter 1678 providing a count3 signal at its output, and having its input coupled to the output of a NAND gate 1670. The NAND gate 1670 has a first input coupled to receive the q<0> signal, and a second input coupled to receive the q<1> signal. The count3 signal may represent a counter value of 3 when it has a particular logic level, e.g., a logic high.

Figure 17:
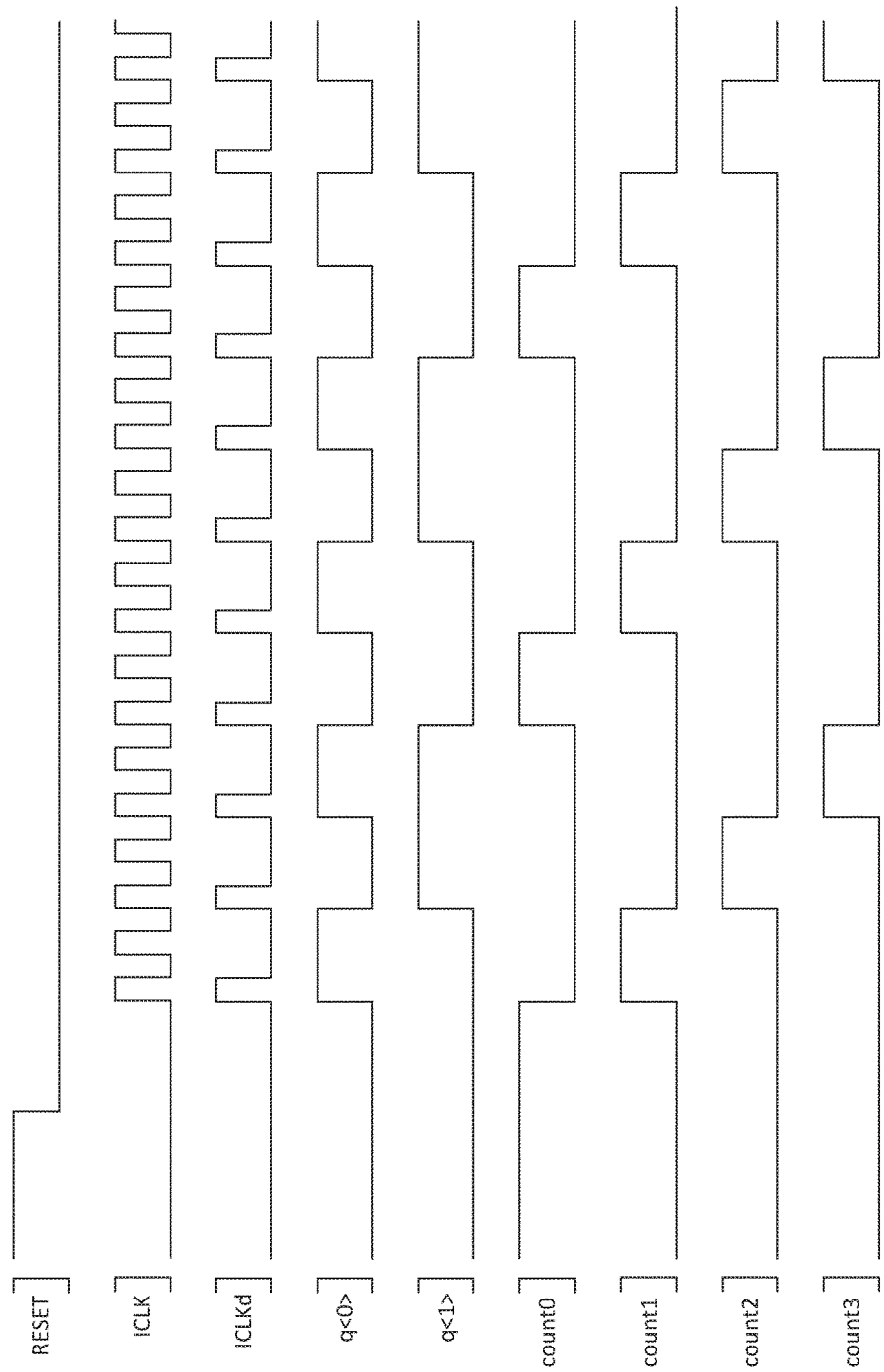
FIG. 17 depicts waveforms for the wrap-around counter of FIG. 16.

FIG. 17 depicts waveforms for the wrap-around counter of FIG. 16. For the example wrap-around counter of FIG. 16, the signals q<0> and q<1> are held to logic low if the RESET signal is asserted, e.g., has a logic high level. In addition, the signals q<0> and q<1> will not transition until the internal clock signal ICLK is enabled while the RESET signal is deasserted, e.g., has a logic low level. As can be seen in FIG. 17, the signals count0, count1, count2 and count3 are successively transitioned to logic high for one period of the divided internal clock signal ICLKd. While the divided internal clock signal ICLKd has, in this example, one-half the frequency of the internal clock signal ICLK (e.g., using a 2:1 clock divider), other divisions are possible. For example, where the internal clock signal ICLK has one primary clock cycle to every three secondary clock cycles, the internal clock signal ICLK could be provided to a 4:1 clock divider to produce the appropriate divided internal clock signal ICLKd to generate one count of the wrap-around counter for each primary clock cycle of the internal clock signal ICLK.

When the last count signal, e.g., signal count3 is transitioned logic low, the wrap-around counter returns to transition the signal count0 to logic high to repeat the cycle while the internal clock signal ICLK is enabled. Thus, for an embodiment using four dies, each die could look to a respective count signal of the wrap-around counter of FIG. 16 to determine when the wrap-around counter value matches a counter value assigned to that die. For example, a die assigned a counter value of 0 could deem the counter value to be 0 when the signal count0 has a logic high level, a die assigned a counter value of 1 could deem the counter value to be 1 when the signal count1 has a logic high level, a die assigned a counter value of 2 could deem the counter value to be 2 when the signal count2 has a logic high level, and a die assigned a counter value of 3 could deem the counter value to be 3 when the signal count3 has a logic high level.

While the wrap-around counter of FIG. 16 depicted an example for generating counter values of 0 to 3 (e.g., a 2-bit counter), wrap-around counters having different counter values may be designed by those of ordinary skill in the art. For example, a wrap-around counter for generating counter values of 0 to 1 (e.g., a 1-bit counter) might be obtained using a single D flip-flop, where a counter value of 0 might correspond to a normal output having a logic high level, and a counter value of 1 might correspond to an inverted output having a logic high level. In addition, a wrap-around counter for generating counter values of 0 to 7 (e.g., a 3-bit counter) might be obtained by repeating the circuitry for generating signals q<0> and q<1>, but providing signal q<0> to the clock inputs of the two D flip-flops to generate signals q<2> and q<3> (not shown) at the outputs of the two additional D flip-flops. The resulting signals q<0>, q<1>, q<2> and q<3> could then be logically combined to generate eight count signals, each successively transitioning to a logic high level for one period of the divided internal clock signal ICLKd. Similarly, logic levels representative of particular states or counter values can be altered as desired using appropriate combinatorial logic.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. For example, while operation might have been described as being enabled or activated in response to a first logic level, and disabled or deactivated in response to a second logic level, it would be a straightforward task to alter the logic to enable/activate in response to the second logic level, and disable/deactivate in response to the first logic level. Similarly, while the discussion referred to voltage supply nodes and reference potential nodes as corresponding to high and low voltages, respectively, these conventions could also be reversed. Accordingly, this application is intended to cover any adaptations or variations of the embodiments.

What is claimed is:

1. An apparatus, comprising:
   an array of memory cells;
   a controller to perform access operations on the array of memory cells;
   a clock signal node;
   a clock generator; and
   a counter having an input;
   wherein the controller is configured to selectively activate circuitry of the apparatus to provide either a signal from the clock signal node or a signal from an output of the clock generator to the input of the counter;
   wherein the controller, when performing an access operation on the array of memory cells that is deemed to comprise a period of high current demand, is further configured to provide an indication that it has entered the period of high current demand; and
   wherein the controller is further configured to provide the indication for a particular number of cycles of the signal received by the counter.

2. The apparatus of claim 1, wherein the input of the counter is connected to receive a signal from the clock signal node when an input buffer between the clock signal node and the input of the counter is activated, and to receive a signal from the output of the clock generator when the clock generator is activated.

3. The apparatus of claim 2, wherein the clock signal node is connected to receive a signal from the clock generator when the clock generator and an output buffer between the clock signal node and the clock generator are both activated.

4. The apparatus of claim 1, wherein the controller is configured to resume a paused access operation in response to, at least in part, a value of the counter.

5. The apparatus of claim 1, wherein the clock signal node is configured for connection to an external device.

6. The apparatus of claim 1, wherein the apparatus is a first apparatus, and wherein the clock signal node of the first apparatus is connected to a clock signal node of a second apparatus, the second apparatus further comprising:
   an array of memory cells;
   a controller to perform access operations on the array of memory cells of the second apparatus;
   a clock generator; and
   a counter having an input connected to selectively receive a signal from the clock signal node of the second apparatus and from an output of the clock generator of the second apparatus.

7. An apparatus, comprising:
   an array of memory cells;
   a controller to perform access operations on the array of memory cells;
   a clock signal node;

a counter comprising a clock divider;
a clock generator; and
an input buffer connected between the clock signal node and the counter;
an output buffer connected between the clock generator and the clock signal node;
wherein the counter is connected to receive a signal at its clock divider from the clock signal node when the input buffer is activated, and to receive a signal at its clock divider from the clock generator when the clock generator is activated;
wherein the counter is configured to count cycles of a divided signal output from the clock divider;
wherein the controller is configured to activate the output buffer and to deactivate the input buffer when the clock generator is activated; and
wherein the controller is further configured to activate the input buffer and to deactivate the output buffer when the clock generator is deactivated.

8. The apparatus of claim 7, wherein a signal received by the clock signal node from the clock generator when the output buffer is activated and the clock generator is activated, and the signal received by the counter at its clock divider from the clock generator when the clock generator is activated, are a same clock signal.

9. An apparatus, comprising:
an array of memory cells;
a controller to perform access operations on the array of memory cells;
a clock signal node;
a second signal node;
a counter;
a clock generator;
an input buffer connected between the clock signal node and the counter; and
an output buffer connected between the clock generator and the clock signal node;
wherein the counter is connected to receive a signal from the clock signal node when the input buffer is activated, and to receive a signal from the clock generator when the clock generator is activated;
wherein the controller is configured to activate the output buffer and to deactivate the input buffer when the clock generator is activated;
wherein the controller is further configured to activate the input buffer and to deactivate the output buffer when the clock generator is deactivated;
wherein the signal received by the counter from the clock signal node or the clock generator is an input clock signal;
wherein the counter is configured to count one cycle of every N cycles of the input clock signal, with N having an integer value greater than or equal to two; and
wherein the controller is further configured to determine when the second signal node has a particular logic level during remaining cycles of the N cycles of the input clock signal for each of at least one value of the counter.

10. The apparatus of claim 9, wherein the at least one value of the counter comprises each value of the counter other than a particular value of the counter.

11. The apparatus of claim 9, wherein the controller is further configured to determine whether to resume a paused access operation in response to at least a number of cycles of the input clock signal for which the second signal node was determined to have the particular logic level.

12. The apparatus of claim 9, wherein the counter is a wrap-around counter having M possible values with M having an integer value greater than or equal to two, wherein the controller is further configured to count a number of the remaining cycles of the N cycles of the input clock signal when the second signal node has the particular logic level for each of the at least one value of the counter, and wherein the controller is further configured to generate a tallied value responsive to at least the count for each of the at least one value of the counter for a cycle of the M possible values of the counter.

13. The apparatus of claim 12, wherein the controller is configured to generate the tallied value further responsive to the value of the counter for each of the respective counts.

14. The apparatus of claim 13, wherein each of the at least one value of the counter is associated with a respective multiplier, and wherein the controller is configured to generate the tallied value responsive to the count for each of the at least one value of the counter for the cycle of the M possible values of the counter times the respective multiplier associated with each of the at least one value of the counter for the cycle of the M possible values of the counter.

15. An apparatus, comprising:
a plurality of memory devices, each memory device of the plurality of memory devices comprising:
an array of memory cells;
a controller to perform access operations on the array of memory cells;
a clock signal node;
a second signal node;
a counter; and
a clock generator;
wherein the counter is connected to receive a clock signal from the clock signal node or from the clock generator;
wherein the controller is configured to determine when the second signal node has a particular logic level, to pause one or more of the access operations at designated points, and to resume a paused access operation of the one or more of the access operations in response to, at least in part, a value of the counter and a number of cycles of the received clock signal when the second signal node was determined to have the particular logic level;
wherein the clock signal nodes of the plurality of memory devices are commonly connected; and
wherein the second signal nodes of the plurality of memory devices are commonly connected.

16. The apparatus of claim 15, wherein, for at least one memory device of the plurality of memory devices, its counter is connected to receive the clock signal from its clock signal node when an input buffer between its counter and its clock signal node is activated, and to receive the clock signal from its clock generator when its clock generator is activated.

17. The apparatus of claim 16, wherein, for at least one memory device of the plurality of memory devices, when its clock generator is activated, its clock signal node is connected to receive the clock signal from its clock generator when an output buffer between its clock signal node and its clock generator is activated.

18. The apparatus of claim 15, wherein, for at least one memory device of the plurality of memory devices, its controller is further configured to determine whether a clock signal is active on its clock signal node, and to activate its clock generator if a clock signal is determined not to be active.

19. The apparatus of claim 15, wherein the respective controller for each memory device of the plurality of memory devices is configured to cause its second signal node to pull to the particular logic state when that memory device is resuming an access operation of the one or more of the access operations paused at a designated point of that paused access operation.

20. The apparatus of claim 15, wherein, for each memory device of the plurality of memory devices, its counter is further configured to divide its received clock signal, and to count cycles of the divided clock signal.

21. The apparatus of claim 1, wherein the particular number of cycles is indicative of an expected level of current consumption of the period of high current demand.

* * * * *